United States Patent
Fujimura et al.

(10) Patent No.: US 7,824,828 B2
(45) Date of Patent: Nov. 2, 2010

(54) METHOD AND SYSTEM FOR IMPROVEMENT OF DOSE CORRECTION FOR PARTICLE BEAM WRITERS

(75) Inventors: Akira Fujimura, Saratoga, CA (US); Daisuke Hara, Yokohama (JP); Katsuo Komuro, Ichikawa (JP); Takashi Mitsuhashi, Fujisawa (JP)

(73) Assignee: Cadence Design Systems, Inc., San Jose, CA (US)

( * ) Notice: Subject to any disclaimer, the term of this patent is extended or adjusted under 35 U.S.C. 154(b) by 788 days.

(21) Appl. No.: 11/677,973

(22) Filed: Feb. 22, 2007

(65) Prior Publication Data

US 2008/0203324 A1     Aug. 28, 2008

(51) Int. Cl.
*G03F 9/00* (2006.01)
*G03C 5/00* (2006.01)

(52) U.S. Cl. .................. 430/30; 430/296; 430/942; 250/492.2; 250/492.3

(58) Field of Classification Search ............ 250/492.22, 250/492.2; 430/30
See application file for complete search history.

(56) References Cited

U.S. PATENT DOCUMENTS

| | | | | |
|---|---|---|---|---|
| 5,051,598 A | * | 9/1991 | Ashton et al. | ............ 250/492.2 |
| 5,241,185 A | | 8/1993 | Meiri et al. | |
| 5,424,173 A | | 6/1995 | Wakabayashi et al. | |
| 5,563,419 A | | 10/1996 | Tamura | |
| 5,847,959 A | * | 12/1998 | Veneklasen et al. | ......... 700/121 |
| 5,863,682 A | * | 1/1999 | Abe et al. | ..................... 430/30 |
| 6,107,207 A | | 8/2000 | Waas et al. | |
| 6,243,487 B1 | | 6/2001 | Nakajima | |
| 6,370,441 B1 | | 4/2002 | Ohnuma | |
| 6,373,071 B1 | * | 4/2002 | Innes et al. | ............ 250/492.22 |
| 6,379,851 B1 | * | 4/2002 | Innes | ........................ 430/30 |
| 6,646,275 B2 | | 11/2003 | Oae et al. | |
| 6,720,565 B2 | * | 4/2004 | Innes et al. | ............ 250/492.22 |
| 6,815,693 B2 | | 11/2004 | Kamijo et al. | |
| 7,205,078 B2 | | 4/2007 | Osawa et al. | |
| 2003/0054580 A1 | | 3/2003 | Yamamoto et al. | |
| 2004/0268289 A1 | | 12/2004 | Sandstrom et al. | |

OTHER PUBLICATIONS

Abe T. et al., "Proximity effect correction for an electron beam direct writing system EX-7" J. Vac. Sci. Technol. B 7(6), pp. 1524-1527, Nov./Dec. 1989.

Magoshi S. et al., "Proximity effect correction on the multi-level interconnect metal for high-energy electron-beam lithography", Prc. SPIE vol. 5037, pp. 1035-1042, 2003.

(Continued)

*Primary Examiner*—Nikita Wells
*Assistant Examiner*—Johnnie L Smith
(74) *Attorney, Agent, or Firm*—Vista IP Law Group LLP

(57) ABSTRACT

A method and system for dose correction of a particle beam writer is disclosed. The method and system includes reading a file of writing objects that includes dose intensity, calculating a rate of dose intensity change between adjacent writing objects, selecting a writing object that may need accuracy improvement of dose correction based on the rate of dose intensity change, and improving accuracy of the dose correction of the writing object that is selected and its adjacent objects.

47 Claims, 16 Drawing Sheets

OTHER PUBLICATIONS

Onigo K. et al., "3D Proximity Correction for Multi-Layer Structure in EB Lithography" Abstract of MNC2003, pp. 160-161-, 2003.
Takahashi, K. et al., "Proximity effect correction using pattern shape modification and area density map" J. Vac. Sci. Technol. B 18(6), pp. 3150-3157, Nov./Dec. 2000.
Lapanik et al.U.S. Appl. No. 11/607,753, filed Nov. 11, 2006.
Mitsuhashi,T. U.S. Appl. No. 11/678,530, filed Feb. 2, 2007.
Fujimura, A. et al. U.S. Appl. No. 11/603,603, filed Nov. 21, 2006.
Yoshida, K., U.S. Appl. No. 11/603,441, filed Nov. 21, 2006.
Yoshida et al. U.S. Appl. No. 11/607,305, filed Dec. 1, 2006.
Hara et al. U.S. Appl. No. 11/603,527, filed Nov. 11, 2006.
Hara et al. U.S. Appl. No. 11/603,526, filed Nov. 11, 2006.
Mitsuhashi,T. U.S. Appl. No. 11/226,253, filed Sep. 15, 2005.
International Search Report and Written Opinion dated Mar. 13, 2008 for PCTIUS2007/085137.
Office Action dated Jan. 5, 2009 for U.S. Appl. No. 11/603,527.
Final Office Action dated Jun. 29, 2009 for U.S. Appl. No. 11/603,527.
Non-Final Office Action dated Oct. 23, 2009 for U.S. Appl. No. 11/603,527.
Kawano et al. "Technology of EB Lithography System for 65-nm Node Mask Writing", Hitachi Review, vol. 54 (2005), No. 1, pp. 37-41.
Sohda et al. "Recent progress in cell-projection electron-beam lithography", Microelectronic Engineering 67-68 (2003), pp. 78-86.
Final Office Action dated Apr. 19, 2010 for U.S. Appl. No. 11/603,527.

* cited by examiner

| 0.852 C20 | 0.852 C21 | 0.852 C22 | 0.852 C23 | 0.852 C24 | 0.852 C25 |
| --- | --- | --- | --- | --- | --- |
| 0.854 C10 | 0.854 C11 | 0.854 C12 | 0.854 C13 | 0.854 C14 | 0.854 C15 |
| 0.801 C00 | 0.804 C01 | 0.804 C02 | 0.801 C03 | 0.801 C04 | 0.804 C05 |

| 0.688 $V_{20}$ | 0.680 $V_{21}$ | 0.680 $V_{22}$ | 0.688 $V_{23}$ | 0.688 $V_{24}$ | 0.680 $V_{25}$ |
| --- | --- | --- | --- | --- | --- |
| 0.661 V10 | 0.651 V11 | 0.651 V12 | 0.661 V13 | 0.661 V14 | 0.651 V15 |
| 0.666 V00 | 0.657 V01 | 0.657 V02 | 0.666 V03 | 0.666 V04 | 0.656 V05 |

[ ] CP CELL     [ ] VSB

FIG. 2
(PRIOR ART)

METHOD AND SYSTEM FOR IMPROVEMENT OF DOSE CORRECTION FOR PARTICLE BEAM WRITERS

BACKGROUND

1. Field

The field of the invention relates to particle beam writing and lithograph technologies for fine image fabrication and, in particular, to proximity effect correction.

2. Description of Related Art

For generating fine images on a plate by lithographic technologies, particle beam writing methods and optical projection methods that uses a photo-mask consisting of transparent and opaque parts have been used. An example of particle beam writing technology includes an electron beam writer, which is used for writing fine images on both silicon wafers and glass masks for optical projection lithography. A technology that uses electron beam writers for writing fine images for semiconductor integrated circuits directly on the semiconductor wafer is referred to as electron beam direct writing (EBDW) technology.

A fundamental problem with conventional lithographic technologies is image quality degradation and resolution limits caused by chemical and physical effects in the process of the technologies. The degradation or difference between obtained image and intended pattern worsens when image size is increasingly reduced. Proximity effect is a dominant issue among these effects.

Proximity effect correction is mandatory for a particle beam writer, such as an electron beam writer. Proximity effect is a degradation or variation of a written image caused by scattering of incidence particles in resist or backscattering or reflecting particles from lower layers of the resist. In general, the plate or photomask is coated with particle beam sensitive resist.

Conventional electron beam (EB) writers can write complicated patterns by one shot. Variable Shaped Beam (VSB) type EB writers can write a predefined rectangle/triangle/trapezoid pattern by one shot. Cell Projection (CP) type EB writers can write complex patterns defined on a stencil plate by one shot. However, the size of CP cells on the stencil plate has limitations. The allowable size of the commonly used CP cell is several microns by several microns.

In both VSB and CP type writing, the dose or number of particles, such as electrons, in a shot can be controlled by exposure time. In one aspect, the quantity of injected particles is referred to as the dose. FIG. 1A (A) 100 shows a low dose case, and FIG. 1A (B) 102 shows a high dose case. Referring to FIG. 1A, a higher dose 110 provides more fat images 120 as a result. In one aspect, "Threshold" indicates a level of dose intensity over which an image of the lithography appears.

Embodiments of several proximity effect correction methods are proposed herein. One embodiment refers to a dose correction method that corrects proximity effect by controlling dose used for VSB or CP shots. This is a correction method that uses pattern fattening phenomenon caused by increasing dose, as shown in FIG. 1A. Another embodiment refers to a proximity effect correction (PEC) by pattern that corrects proximity effect by modifying writing patterns or adding auxiliary patterns. These auxiliary patterns are sometimes referred to as assist pattern or dummy pattern. PEC methods, that use pattern modification like slimming down or fattening up some parts of the pattern and add serif to the pattern for obtaining intended images, are also classified as a PEC method that uses auxiliary patterns. Hereafter, all these types of correction methods may be referred to as Proximity Effect Correction (PEC) by pattern.

Most of the EB writers for mask writing are realized only by VSB type functionality. PEC by pattern method is not suitable for VSB type EB writers because pattern modification or auxiliary patterns increase the number of shots needed, and as a result, writing time becomes longer. Therefore, the dose correction method is dominant for VSB type EB writers. On the other hand, by using CP cell type writer, plural patterns are written by one CP shot and dose correction among patterns in the CP cell or to use different dose for writing patterns in the CP cell is impossible. As a result of above mentioned discussion, a problem occurs in which the width of obtained images vary depending on the position in the CP cell, although the target width is identical among those patterns.

In general, there is no way to correct proximity effect by dose modulation between patterns in a CP cell because those are written by one shot. One of the few possible methods is to correct the proximity effect by pattern modification. When use of Electron Beam Direct Writing (EBDW) is considered for wafer writing, maximization of writing by the CP cell method is preferable for shortening writing time. However, there currently exists a need for a proximity effect correction method that is applicable to both CP and VSB writing and satisfies the demand for speed and accuracy. Even for mask writers, the use of CP cells contributes to the improvement of writing speed.

A proximity correction method that aims for high accuracy by correcting both dose and pattern and is applicable to both VSB and CP writing has been proposed. However, the proposed PEC by pattern focuses on only one direction of the pattern consisting of line width and does not consider line edge shortening. There currently exists a need for a more accurate PEC that considers not only one-dimensional correction but also two dimensional corrections.

Conventional technologies for proximity effect correction by dose or dose correction has been proposed. However, proximity effect correction by conventional dose correction methods is not enough. Proximity effect correction without modification of the writing object pattern has limitations, and conventional methods have no means to modify patterns.

FIG. 1B depicts a conventional issue caused by the mixture of writing by VSB (Variable Shaped Beam) and CP (Cell Projection). A pattern indicated by CP Cell-I is shown in this example. The CP cell comprises three rectangles, R1, R2 and R3. Deposited energy by nearby patterns on a line AA' is depicted by a curve indicated by "Deposited Energy" in chart 130. In chart 130, a left vertical axis shows "Deposited Energy" by incidence of the particle beam including backscattering from the neighborhood, and a vertical axis in right side shows dose intensity for each writing object. A horizontal axis shows positional coordinate on the line AA'. For CP cell writing case, all patterns included in a CP cell, for this specific case, R1, R2 and R3 are written by the same dose intensity. R1, R2 and R3 are written by the same dose indicated by "Dose for CP".

FIG. 1B illustrates the limitation of conventional dose correction that is exposed by the structure of writing objects. As shown, a case of writing a CP Cell, indicated by CP Cell-1, is considered. Writing objects located near CP Cell-1 create a distribution of deposited energy indicated by "Deposited Energy" by backscattering. Optimal dose intensity for each rectangle R1, R2, and R3 are independently determined as indicated by "Dose for R1", "Dose for R2", and "Dose for R3" in the distribution of deposited energy. However, pattern dimension differences occur between R1, R2, and R3, if a CP Cell is used and as a result same dose intensity is applied to three writing objects. Even VSB writing and enough large writing pattern are assumed, the case could occur in which correction by dose cannot compensate the proximity effect.

FIG. 2 shows an example of conventional dose correction results for a mixture of CP cell and VSB writing objects. The dose intensity of each writing object is indicated by a number. Rectangles indicated by V00 thought V25 are writing objects written by VSB. A number, such as 0.666 in each rectangle, is dose intensity calculated by a correction program for the writing object. This pattern is an example of a situation where relatively small CP cells are placed on a wide large rectangle consisting of V00~V25.

FIG. 2 depicts a layout example that may cause the above mentioned problems. In this layout, backscattering by large rectangle pattern written by VSB shots V00~V25, provides a large influence on patterns written by CP Cells indicated by C00~C25. Especially, influence to CP Cell, C00~C05 is large. As a result of the deposited energy gradient, dose for C00~C05 is different from that for other CP Cells. In the example of FIG. 2, the size of the CP Cell is 2.15 um in width and 3 um in height, and the distance between the bottom of the CP Cell and the top of VSB is 1.25 um.

The problem discussed above can be solved by changing patterns written by the CP Cell to VSB and by fracturing patterns small enough to avoid the problem. However, changing the CP Cell to VSB and miniaturization of the writing pattern causes a problem of a long writing time. There currently exists a need to solve inconsistent demands for accuracy and short computation time.

One of the possible solutions for the above mentioned issues is an adoption of "Correct-by-construction" approach that is characterized by following the steps of: finding a temporary solution of dose correction by conventional method and improving the accuracy of the solution at the region. "Correct-by-construction" approach is not reported in the dose correction area. The reasons for this include a lack of technology that detects inaccurate part of a whole chip layout from dose correction point of view and effective and practical way of improving the accuracy of dose correction. There currently exists a need to provide both accuracy of writing and high throughput to particle beam writers.

In LSI design process, partial modification of the layout by design change occurs frequently. Thus, there currently exists a need to provide an efficient recalculation method of dose correction.

SUMMARY

Embodiments of the invention presented herein relate to particle beam writing and lithograph technologies for fine image fabrication, and in particular to proximity effect correction. One example of lithograph technology by particle beam writing includes an electron beam (EB) writing device. The fundamental problem with conventional lithography technology is the image quality degradation from the intended patterns that is caused by proximity effects. This problem can be solved by a technology referred to as proximity effect correction. As presented herein, proximity effect correction methods include modification of patterns and correction by dose quantity of the incidence particles. Among the disclosed proximity effect correction methods, embodiments of the invention described herein are related to the field of dose correction and the following technologies.

Method and system of dose correction for a particle beam writing device including an electron beam (EB) writing device.

An improvement method and system for dose correction that is applicable to a mixture of VSB (Variable Shaped Beam) and CP (Cell Projection) writing, which comprises detecting a region where correction is insufficient and improving dose correction of the region.

In one embodiment, a calculation method and system for dose correction, which reduces computation time by finding out a minimal set of writing objects that may need update of the dose and doing dose correction of the minimal set.

An efficient calculation method and system for recalculation of dose intensity, which is related to a modification of pattern layout.

It should be appreciated by those skilled in the art that embodiments of the invention presented herein may be applied to any type of particle beam lithography technologies, including electron beam (EB) lithography, optical laser beam lithography and X-ray beam lithography, which transcribe patterns using at least two apertures (stencil masks) and source of particle beams, such as optical laser beam and X-ray beam, as well as electron beam lithography.

In one embodiment, a method for dose correction of a particle beam writing device includes reading a file of one or more writing objects that includes dose intensity, calculating a rate of dose intensity change between adjacent writing objects, selecting at least one writing object that needs accuracy improvement of dose correction based on the rate of dose intensity change, improving accuracy of the dose correction of the at least one selected writing object, and performing dose correction.

In another embodiment, a dose correction method for a particle beam writing device includes identifying one or more meshes that cover a dose correction region, calculating area density of each mesh, computing a ratio of area density difference between adjacent meshes, detecting a mesh that needs splitting, and splitting the detected mesh.

These and other objects and advantages of the present teachings will become more fully apparent from the following description taken in conjunction with the accompanying drawings.

BRIEF DESCRIPTION OF DRAWINGS

FIG. 2 shows an example of dose intensity for a CP pattern and a VSB pattern.

DETAILED DESCRIPTION

Figure 1A:
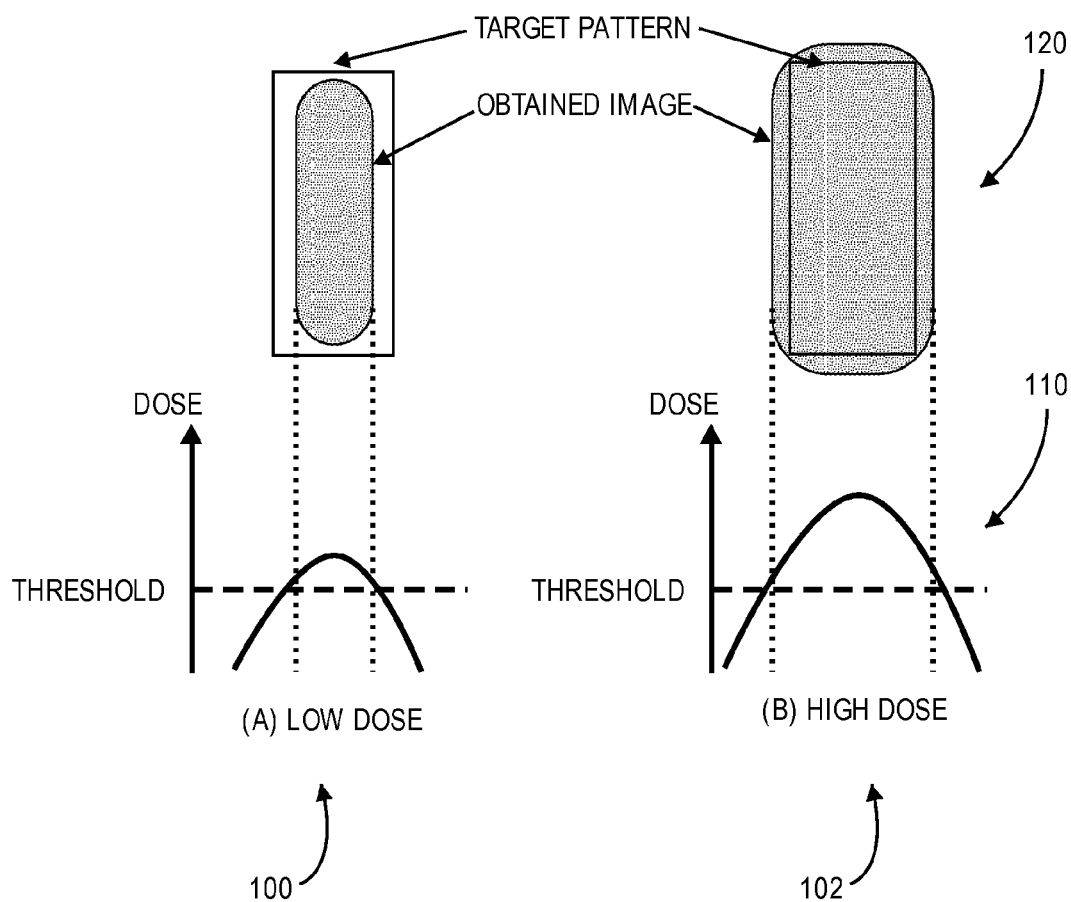
FIG. 1A shows a change of projection image by dose.

Various embodiments of the invention are described herein with reference to the drawings. It should be noted that the drawings are not drawn to scale and that elements of similar structures or functions are represented by like reference numerals throughout the drawings.

In general, it may be difficult to accomplish dose correction of a whole object region in uniform accuracy. For example, highly accurate dose correction may be performed in some part of the object region, but it may be difficult to obtain similar accurate results in other parts or areas of the object region. In one aspect, highly accurate dose correction for one or more parts of the whole chip is possible but may need a relatively large amount of computing resources and is generally not efficient.

Figure 5:
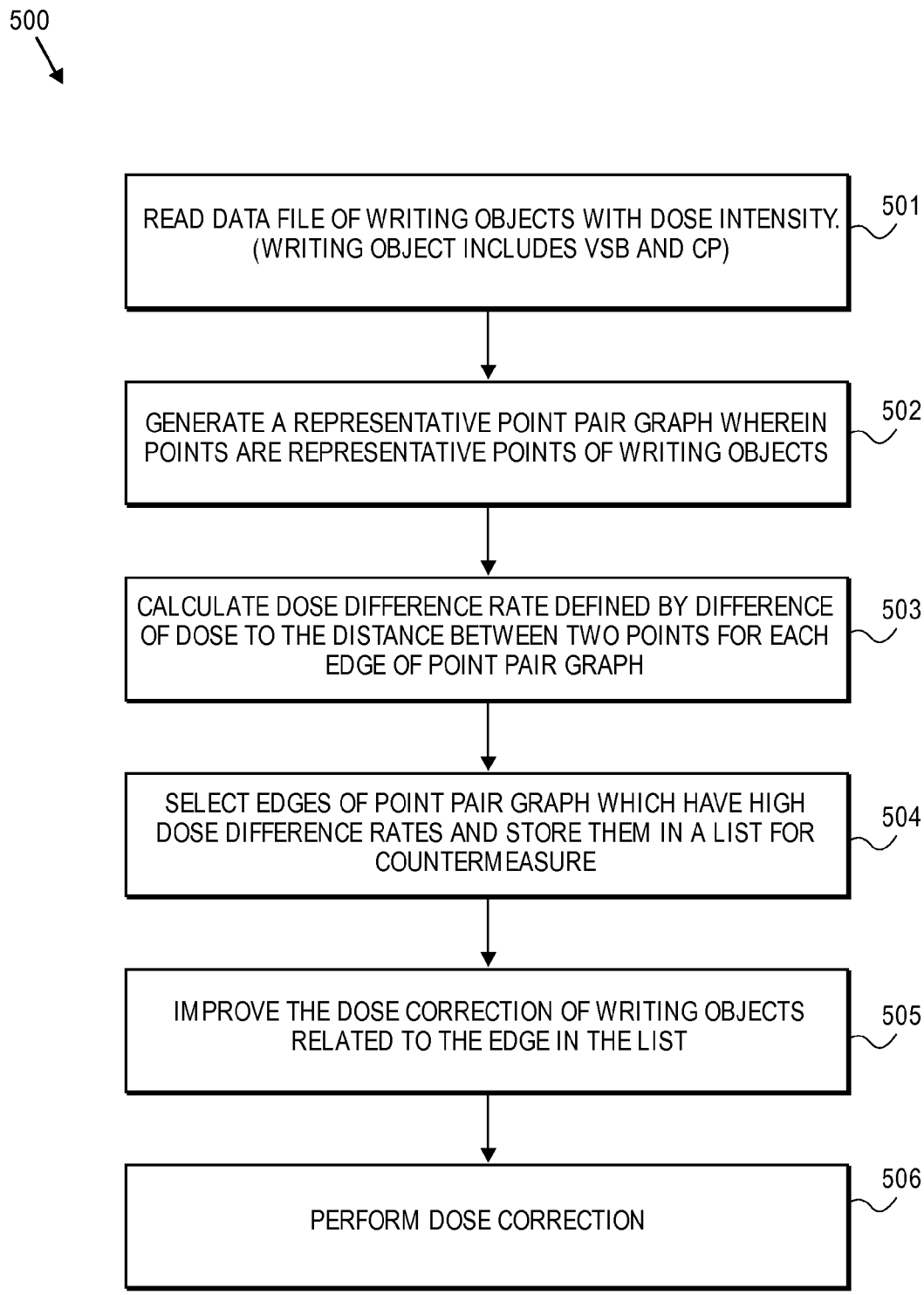
FIG. 5 shows one embodiment of a process flow for dose correction improvement by local modification of writing object.

Referring to FIG. 5, one embodiment of a dose correction method 500 comprises efficient correction with usual accuracy, detection of insufficiently accurate part of the dose correction, and local improvement of the corrected dose intensity. In one aspect, the method 500 enables highly accurate correction. It should be appreciated embodiments of the invention are not limited to the flow chart described in FIG. 5 but several embodiments are possible.

In step 501, the method 500 includes reading one or more data files of writing objects with dose intensity. In one aspect, the writing objects include CP and VSB. In step 502 the method 500 includes generating a representative point pair graph. In one aspect, the points are representative points of the writing objects. In step 503, the method 500 includes calculating a dose correction rate that is defined by the difference in dose to the distance between two points for each edge of the point pair graph. In step 504, the method includes selecting edges of the point pair graph that have high dose difference rates and storing the selected edges in a list for countermeasure. In step 505, the method 500 includes improving the dose correction of writing objects related to the edge in the list. In step 506, the method 500 includes performing dose correction.

Referring to FIG. 5, one embodiment of the method 500 describes a dose correction refinement process and detection of a writing object that may need refinement. As shown, step 501 comprises a data input step for reading pre-calculated dose intensity for the correction. Detecting of a region that has high possibility of low accuracy in the input data is performed. Step 502 and 503 are preprocess steps for detecting a region where accuracy is insufficient.

Figure 6A:
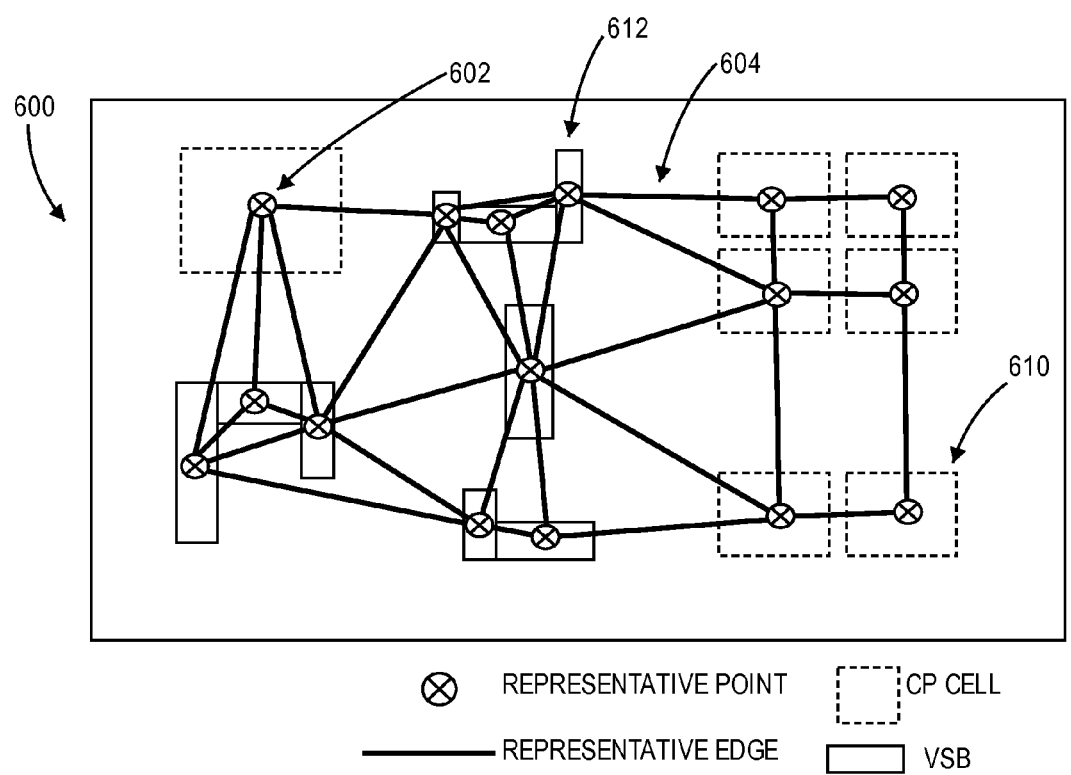
FIG. 6A shows one embodiment of a representative point pair graph for calculating difference of dose intensity between neighboring writing objects.

The first step of this procedure is, as shown in step 502, to search and detect adjacency relations among writing objects in the region. Adjacency relation recognition of a regularly placed writing object, such as shown in FIG. 2, is provided. In some cases, no regularity in size and placement for a real layout is found. For such cases, defining of the adjacency is difficult. FIG. 6A is an example of the above mentioned irregular placement of writing objects and a method that can determine the adjacency relation.

FIG. 6A shows one embodiment of a model for representing adjacency relation that is needed for calculating difference of dose intensity between adjacent points. A line segment shows Representative Edge and an X mark in a circle means Representative Point. Rectangles by solid lines are writing objects written by CP Cells. A Representative Edge connects Representative points whose adjacency is recognized.

Referring to FIG. 6A, an adjacency relation is represented by a graph 600, which is referred to as an Adjacency Graph. The graph 600 comprises a set of points 602 and a set of edges 604. Each point 602 of the graph 600 is referred to as a Representative Point and represents a writing object. In one aspect, an example of the Representative Points are a center of the writing objects, such as a center of a VSB pattern or a center of a bounding box of a CP Cell. As shown in FIG. 6A, the Representative Edge 604 connects the Representative Points 602 in the adjacency relation. CP cells 610 and VSB patterns 612 are also shown.

In one embodiment, a Voronoi diagram can be used to generate an Adjacency graph, and the Voronoi graph may also be referred to as a Territory graph. The territory $Vn(Z_i)$ of a point $Z_i=(x_i,y_i)$ is defined as a set of points, $Vn(Z_i)=\{Z(x,y)|d(Z,Z_i)<d(Z,Z_j), \forall i \neq j\}$.

Figure 6B:
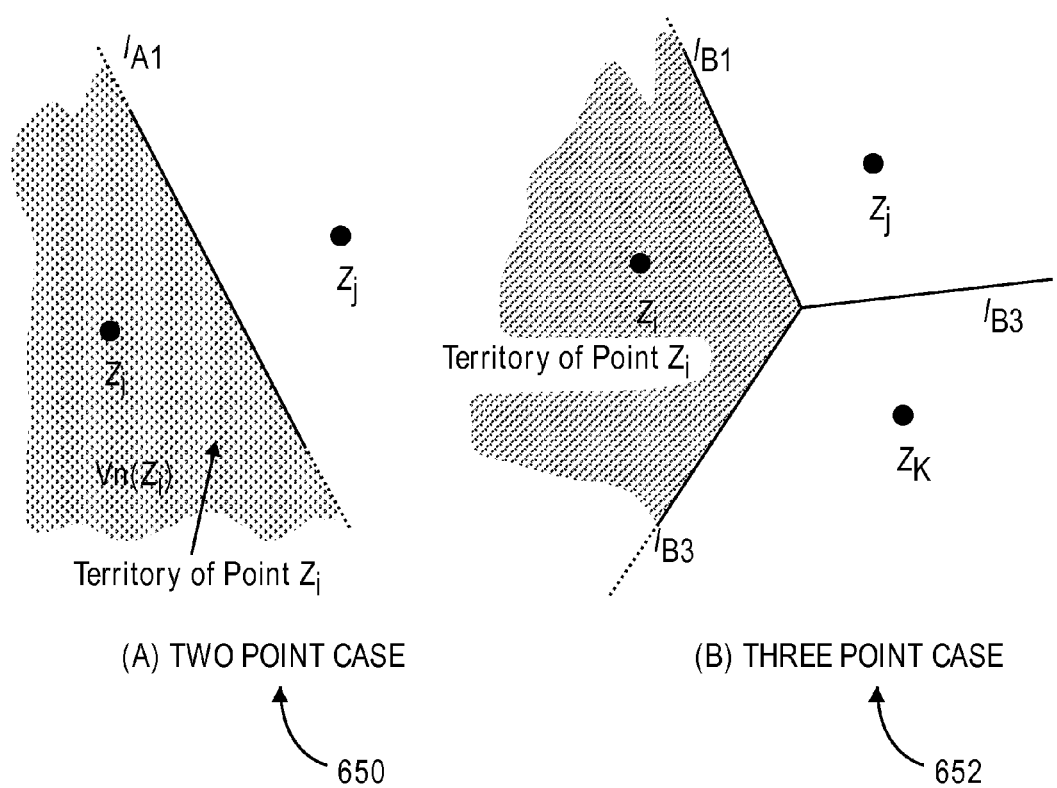
FIG. 6B shows one embodiment of a Voronoi diagram for a two and three point case.

Given two points, $Z_i$ and $Z_j$. $Vn(Z_i)$ is a set of points Z that distance between $Z_i$ and Z is shorter than that of $Z_j$ and Z. Example of two points and three points territory cases are shown in FIG. 6B. Given a set of points on a plane, a graph that divides the plane by territory of the points is referred to as a Voronoi diagram. A method for generating the Voronoi diagram is described in a textbook of standard Computational Geometry. "Computational Geometry An Introduction," Springer-Verlag 1985 by F. P. Preparata & M. I. Shamos is an example.

Referring to FIG. 6A, an example of representative point pair graph shows adjacency of writing objects that are created by generating a Voronoi diagram of FIG. 6B, which vertex is a set of Representative Points.

FIG. 6B shows a concept of Voronoi diagram that is useful for generating the Representative Edge. FIG. 6B (A) 650 shows a two points case, given $Z_i$ and $Z_j$ territory of $Z_i$ is shown by hatched area and right half plane of line $1_{41}$, and FIG. 6B (B) 652 shows a three points case, given $Z_i$, $Z_j$, and $Z_k$ territory of $Z_i$ is shown by hatched area. In one aspect, each territory of $Z_j$, and $Z_k$ is regions divided by semi-lines.

Referring to FIG. 6B, a dual graph of the Voronoi diagram is referred to as a Delaunary trianglurization of the graph. An algorithm is described in the computational geometry textbook. Dose difference of the adjacent writing objects is calculated by differentiating a pair of dose intensities related to vertices or writing objects of the Representative Edge. There may be several definitions for the dose difference. In one aspect, a definition of the dose difference involves subtraction. In another aspect, other possible definitions consider the distance between two Representative Points for a normalization factor of the difference of two dose intensities.

Figure 3:
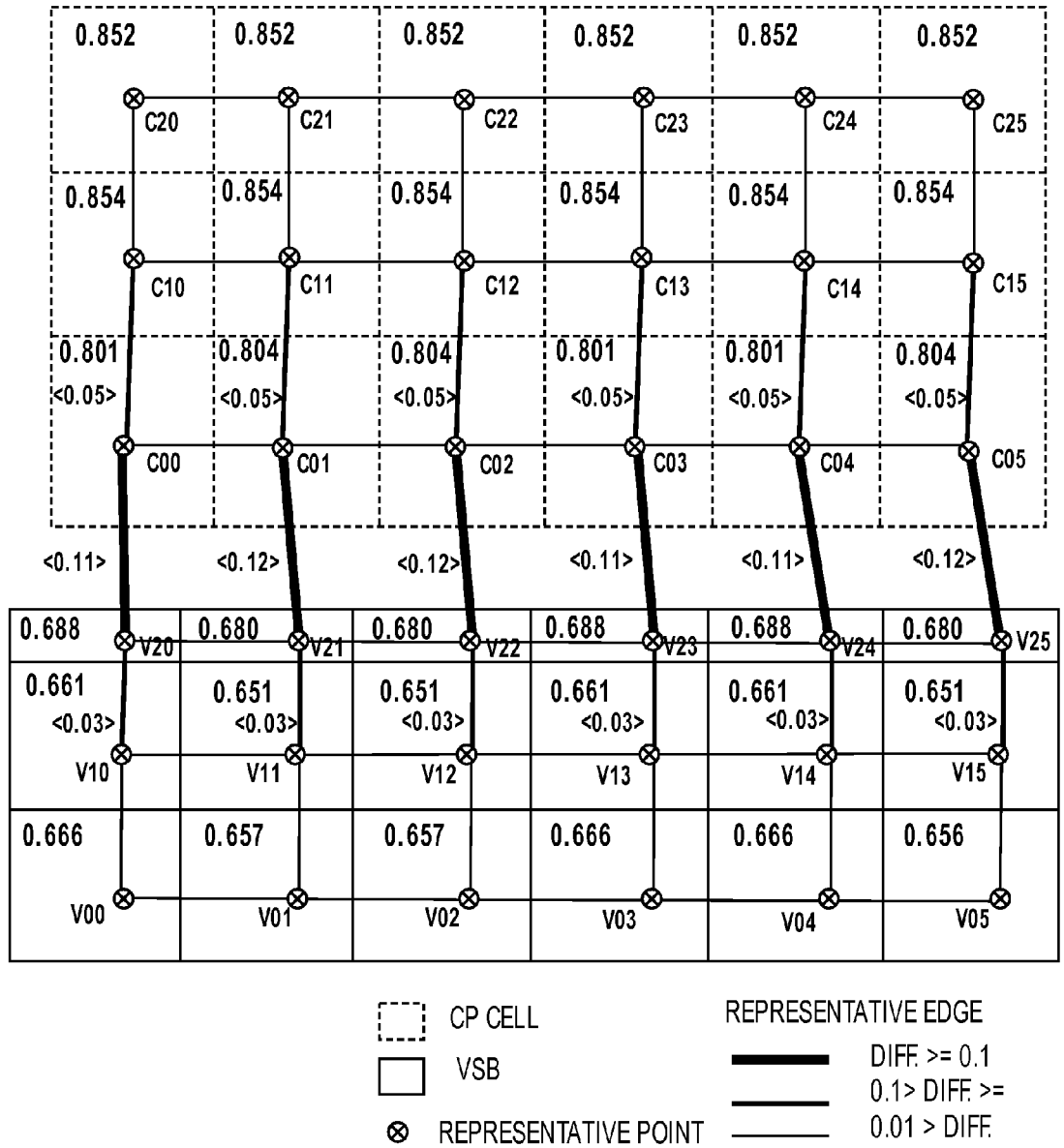
FIG. 3 shows an example of dose intensity and differences between neighbouring writing objects.

A dose difference is shown at a Representative Edge and bracketed by symbol < >, and an adjacency graph for the writing object depicted by FIG. 2 is shown in FIG. 3. In this adjacency graph depicted by FIG. 3, the dose difference between V2$i$-C0$i$ (for i=0, . . . , 5) are significant. The computer simulation results show that the dimensional errors related those writing objects are relatively large for backscattering effects.

FIG. 3 shows a dose intensity example by the dose collection for the mixture of VSB and CP Cell writing objects.

Calculating difference of dose intensity between neighbors writing objects are described. In one aspect, a Representative Point is defined for each rectangle or writing object, a Representative Edge connects Representative Points when the points are located as a neighbor, and the difference of dose intensity between two neighboring Representative Points is corresponding to the Representative Edge and the value is written in < >. As shown in FIG. 3, the thickness of the Representative Edge indicates a quantity of the dose intensity and difference of the points.

In step 504 of method 500 of FIG. 5, the representative edges, whose dose differences are large, are picked up. In the FIG. 3 example, dose differences between V2$i$ and C01, (I=0, . . . , 5) are large and may be in a list that may need countermeasure. The improvement of dose correction is performed in step 505 of method 500 of FIG. 5. This process flow of method 500 represents one example, and several embodiments of this improvement process are possible.

Another embodiment of a refinement method of dose correction will be described in greater detail herein below.

A detailed discussion for refining dose correction results of writing objects whose accuracy is recognized as insufficient will be described.

Figure 1B:
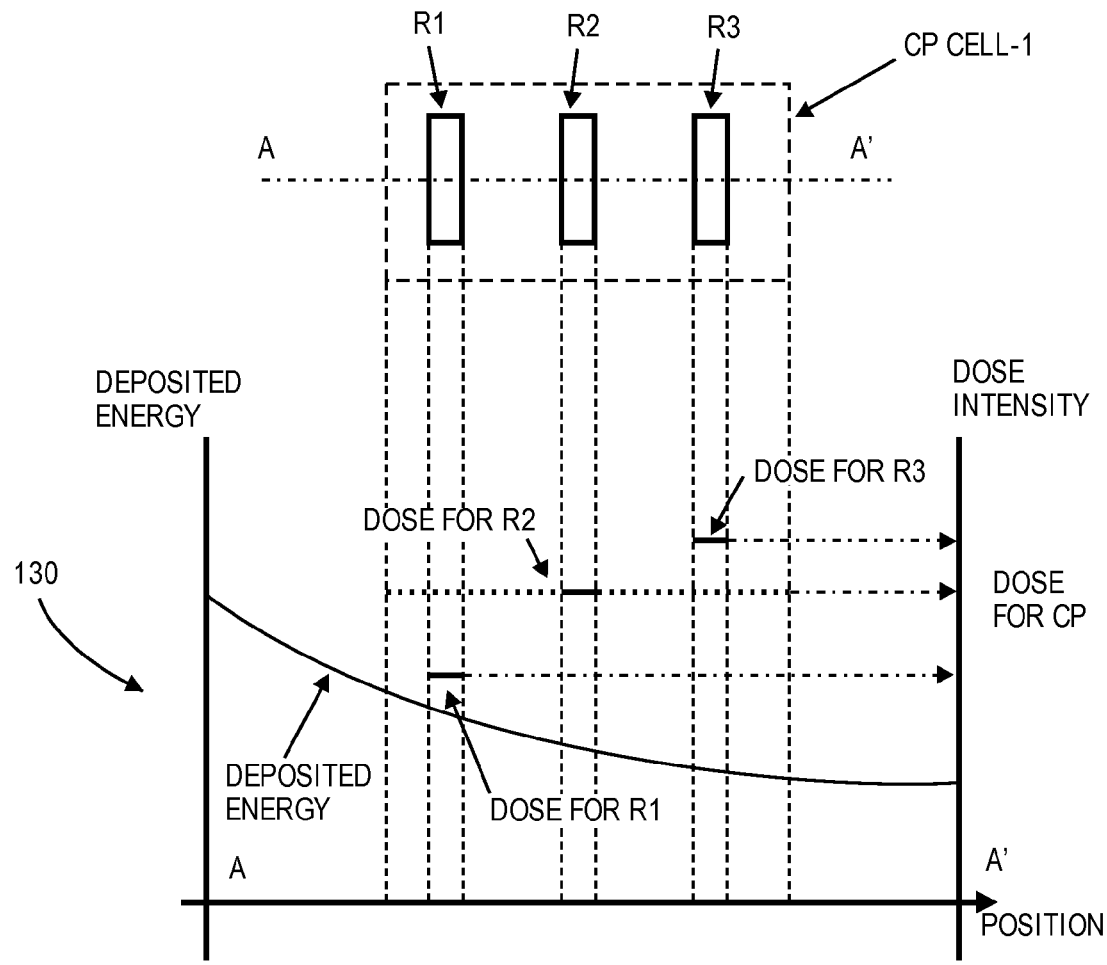
FIG. 1B shows deposited energy and dose intensity for a CP shot and a VSB shot.

One reason for inaccuracy of dose correction is that accurate dose intensity at a part of the writing object is different from another part of the object because of steep gradient of dose intensity by backscattering of adjacent objects. As shown in FIG. 1, although adequate dose intensity of both the left and right edge of CP Cell-1 is different, the same dose intensity is to be applied to the writing object as a nature of CP Cells. Consequently, dimensional accuracy of pattern writing differs depending on the position of the writing object.

From the above CP-Cell writing objects case discussion, accuracy of dose correction is significantly improved by changing a set of patterns in CP Cell that will be written by one shot and one dose to VSB writing or optimally tuned one by one pattern shot. Rectangle R1, R2, and R3 of FIG. 1 is an example of such an inaccurate case.

Figure 4A:
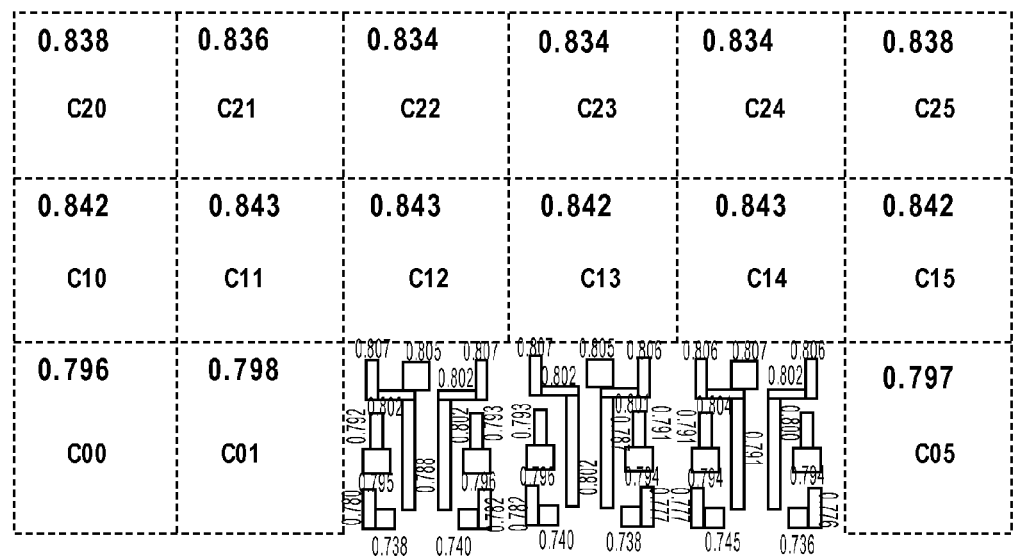
FIG. 4A shows an example of dose intensity for a CP pattern and a VSB pattern in which critical CP cells are transferred into VSB shots.

FIG. 4A shows a dose intensity example by the dose collection for the mixture of VSB and CP Cell writing objects. C02, C03, and C04 which are to be written by CP Cell writing are switched to VSB writing. Dose intensity of each switched writing objects is shown. In one aspect, by investigating dose intensity of writing objects switched from the CP Cell, the intensity of the objects near by the large rectangle composed of V00~V25 is lower than that of far from the rectangle. This shows that a detailed dose correction will improve accuracy of the correction. In one aspect, accurate dose correction becomes possible by embodiments of the invention that switches CP Cells in a region of steep deposition energy gradient.

Referring to FIG. 4A, dose intensity is shown at each of the writing objects including the objects by VSB indicated by V00~V25 and CP Cell indicated by C00~C25. Among CP Cells, C02, C03, and C04 are switched to VSB writing and are shown in FIG. 4A. Dose intensity of rectangles of CP cells is shown, and there is a significant difference between dose intensity of rectangles in the upper and lower part of the CP cell. This difference occurs to compensate the gradient of deposited energy, and low dose is applied to the lower part of the CP cells.

In one aspect, dividing a pattern written by VSB into fine patterns is a means for further improvement of dose correction. A maximum write size of patterns by VSB of particle beam writers, such as an E-beam writer, is several microns by several microns. In general, the size of CP Cell is same to that of VSB, and dose correction is difficult in case the gradient of the background deposition energy is steep. In such a case, the division of a VSB pattern contributes to the improvement of dose correction.

In conventional dose correction, the objective area of dose correction is divided by meshes, and dose is calculated for each mesh. Accuracy of dose correction of this method depends on the size of the mesh. That is, the finer that the mesh division is applied, the more accurate correction result can be obtained.

In one embodiment, highly accurate dose assignment to each mesh is accomplished by detecting inaccurately corrected meshes by a method similar to the detection of countermeasure writing objects and re-dividing the detected meshes. The above mentioned technology partially changes density or coarseness of mesh for improving dose correction. By this method, improvement of both high accuracy and computation time is achievable.

Other dose correction improvement partially uses higher order approximation for correcting dose intensity of the detected insufficiently accurate region. Dose correction by iteratively repeating dose correction of the region that may need improvement and adjacent area by using higher order approximation improves accuracy. For calculating dose intensity of a writing object or a mesh, dose intensity of adjacency objects or meshes are needed. The accuracy of dose correction strongly depends on the accuracy of the adjacent objects or meshes. Improving accuracy of dose correction by using higher order approximation or recalculation for both writing object and adjacent writing object is possible. In one aspect, both accuracy and computing time efficiency are improved by partial refinement of the dose correction.

Embodiments of a method for detecting a writing object that may need countermeasure will be described.

In one embodiment, dose intensity is not necessarily needed for the detection of writing objects that may need countermeasure. Considering a part of the writing region, the dose correction program decreases dose intensity, if the area density is high, where the area density is defined by ratio of writing pattern area to the area of the part of the region. On the other hand, the correction program increases dose intensity to resolve the thinning pattern issue caused by low backscattering in a region where the area density is low. Using these characteristics of area density, the area density may steeply change where the gradient of deposited energy is steep and efforts are needed to improve accuracy of dose correction.

In one aspect, there is no need to calculate dose correction for detecting an inaccurate part of the correction. It is possible to detect a region where accuracy of dose correction is low by a simple calculation using layout information. The accuracy and CPU time efficiency can be compatible by using a mesh generation that uses fine mesh only where area density steeply changes.

Embodiments of pattern dividing on area density of adjacent regions will be described.

Denseness of writing objects and size of mesh that is prepared for approximation of dose correction provide a large influence on the accuracy of dose correction. Improvement of accuracy for dose correction can be achieved by dividing writing objects or mesh for approximation in a region where deposition energy steeply changes.

Figure 4B:
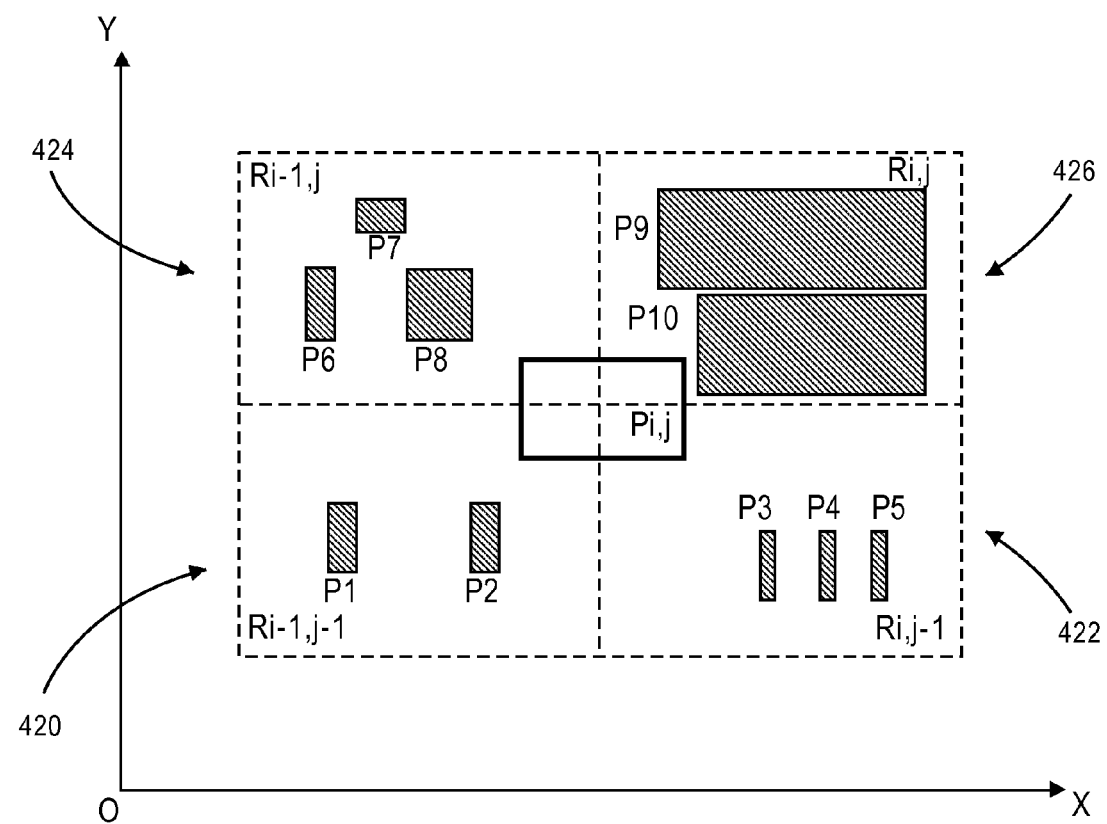
FIG. 4B shows one embodiment of writing pattern partitioning by neighbor pattern density.

FIG. 4B shows an optimal dividing method of a pattern $P_{i,j}$ from the dose correction point of view. In general, dividing of the pattern is referred to as fracturing. In a region where deposited energy changes steeply, accurate dose correction is difficult for relatively large patterns. Fracturing the pattern finer or considering direction of fracturing is efficient way to avoid this issue.

FIG. 4B shows a resolution for the above mentioned dose correction issues. The problem is formulated as whether to divide the writing objects Pi, j or not, and in the second step, how to divide the pattern. The procedure includes extracting patterns that effect the pattern Pi,j. The extracted patterns are referred to as related patterns. Extraction of the related patterns can be possible by selecting patterns in the area that can be reached from the pattern Pi,j by a range of proximity effect. The range of proximity effect can be calculated by the fact that the effect can be negligible apart from four times as far as backscattering range of the particle beam in a sense of computer computation (Electron case, it is about 10 um by radius). Even two times of the backscattering range provides for sufficient accuracy in a practical sense. More accurate results can be obtained by using a wider range, but more computing time is needed. In general, compromise may be needed between accuracy and computing time.

Referring to FIG. 4B, a set of the related patterns is classified into regions Ri−1,j−1, Ri,j−1, Ri−1,j, and Ri,j that are located in lower left 420, lower right 422, upper left 424 and upper right 426, respectively. Calculated area density for each of the four regions is Adi−1,j−1, Adi,j−1, Adi−1,j, and Adi,j, respectively. Number and aspect ratio for the fracturing of the rectangle pattern Pi,j can be determined by difference of area density between the four regions that are between Adi,j and Adi−1,j, Adi,j and Adi,j−1, Adi−1,j−1 and Adi,j−1, and Adi−1,j−1 and Adi−1,j, respectively.

In the example shown in FIG. 4B, area density Adi,j is relatively larger than that of others like Adi−1,j, Adi−1,j−1, and Ai,j−1. So, the slope of deposition energy from Ri,j to Ri−1,j, and from Ri,j to Ri,j−1 is expected to be steep. As a result of above prediction, fine splitting of pattern Pi,j is preferable. While both the X-direction and Y-direction component of the gradient of the deposit energy are large, splitting the long side of Pi,j is needed. No splitting of the pattern might be needed for a direction that had no slope in deposition energy.

Figure 4C:
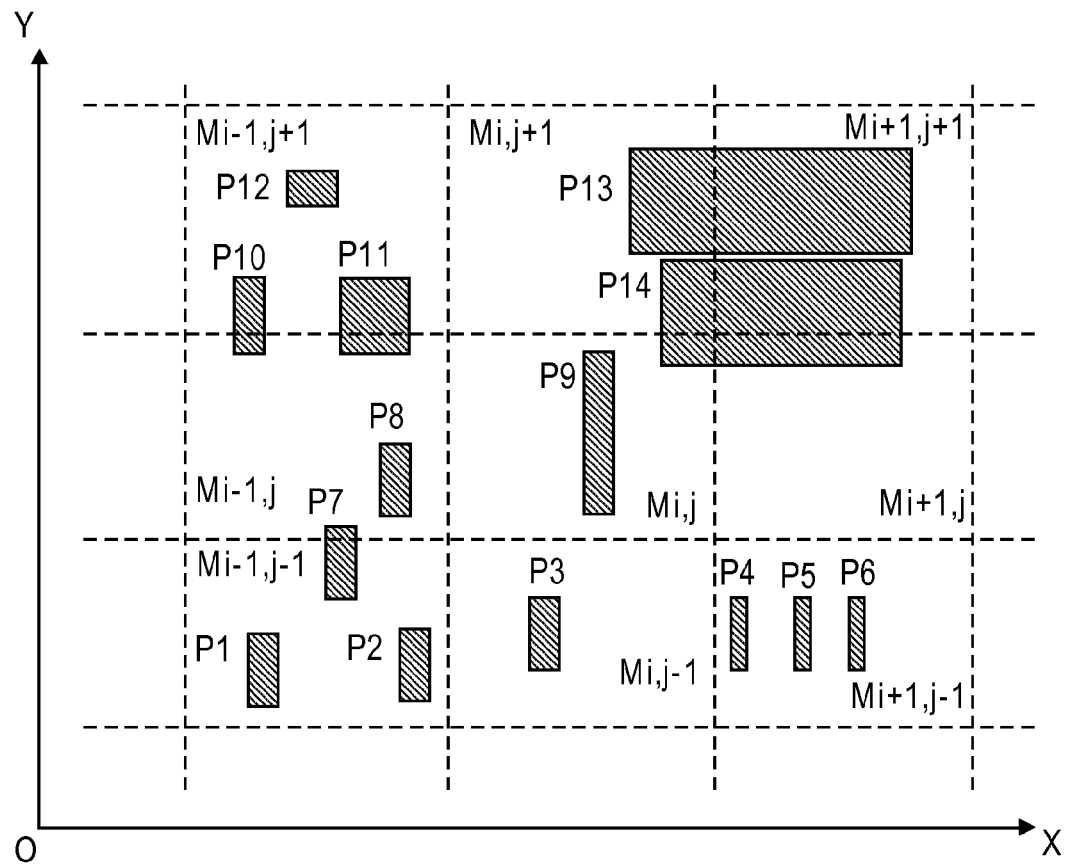
FIG. 4C shows one embodiment of mesh partitioning by pattern density of neighbor mesh.

An approximated dose correction method that uses a mesh dividing a domain for the correction and area density for the mesh can be used. FIG. 4C shows one embodiment of the correction method. P1~P14 indicate writing patterns, and Mi−1,j−1~Mi+1,j+1 are meshes made for dose correction. In this example, the mesh Mi,j is considered for whether it should be divided or not.

Similar to the dividing of the writing object case, meshes within twice of the backscattering range of the particle beam (in e-beam case, about 10 um by radious) from Mi,j are to be considered. Dividing number or manner of the mesh Mi,j is determined by difference or difference pattern of area densities that are derived from meshes located in the neighbor Mi,j, such as left lower, left, left upper, upper, right upper, right, right lower, and lower of the Mi,j.

Embodiments of deposited energy equalization by insertion of dummy patterns will be described.

In one embodiment, the dose correction accuracy improvement technology divides a writing object in a domain where deposited energy steeply changes and finely assigns dose intensity to the divided writing object. Technology by other embodiment for accuracy improvement by relaxing change of deposited energy is possible.

Figure 4D:
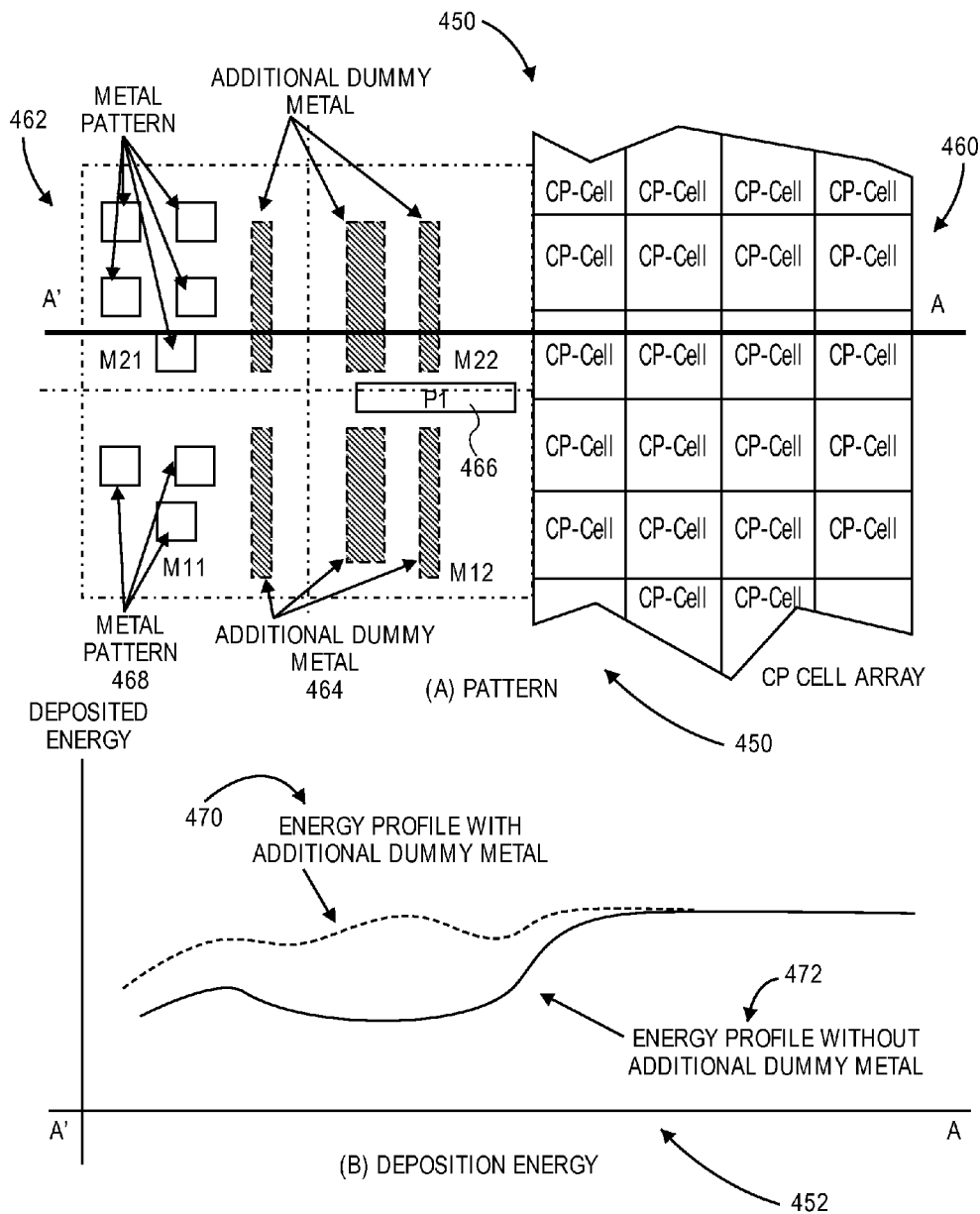
FIG. 4D shows one embodiment of dose profile equalization by additional dummy pattern.

FIG. 4D shows one embodiment of a method and effects thereof, which are characterized by equalization of uneven deposited energy by means of Additional Dummy Metal for flattening the area density. One embodiment of a layout pattern 450 is covered with CP Cells 460, and the area density of the writing pattern is high. As a result of above mentioned situation, the deposited energy profile 472 on line AA' of FIG. 4D is shown by a solid line having unevenness. By placing Additional Dummy Metal 464, unevenness of the profile decreases. A broken line 470 in FIG. 4D (B) 452 shows an improved profile of deposited energy. P1 466 represents a pattern that can be written now. P1 and other patterns indicated by Metal Pattern 468 are meaningful in sense of circuit and mandatory. Patterns indicated by Dummy Metal are meaningless for circuit. M11~M22 are imaginary meshes for calculating metal coverage. A design rule that specifies metal coverage, is defined for metal writing layer that uses CMP (Chemical Mechanical Polishing) for the metal fabrication process.

Referring to FIG. 4D, one embodiment of deposited energy equalization is shown. In FIG. 4D(A) 450, many CP-Cells 460 are placed in the right side of the area, and deposited energy is relatively high. Opposite to the CP-Cells 460, writing patterns 462 are coarse in the left side of the area, and as a result, deposited energy is low. As a result of this difference, deposited energy steeply changes at a boundary of CP-Cell array and coarse pattern area. Because of this steep change of deposited energy, accurate writing of the left most CP-Cells in the CP Cell Array and pattern P1 is difficult. If change of the deposited energy decreases, some processes such as dividing writing objects for improving accuracy of dose correction becomes needless.

In recent multi-metal technology, CMP (Chemical Mechanical Polishing) technology is heavily used for the fabrication. To obtain high quality metal wiring by CMP technology, uniform metal area density is needed. A dummy pattern is frequently used for increasing uniformity of metal area density. The dummy pattern has no meaning in electrical circuit sense and generated merely for helping manufacturing. As shown by dash line 470 of FIG. 4D (B) 452, deposited energy can be flattened by adding a dummy pattern. In many cases, upper and lower limits of the metal coverage is determined as a design rule and enforced. Using this technology, accurate writing can be achievable without using processes, such as changing CP-Cells to VSB patterns.

Figure 4E:
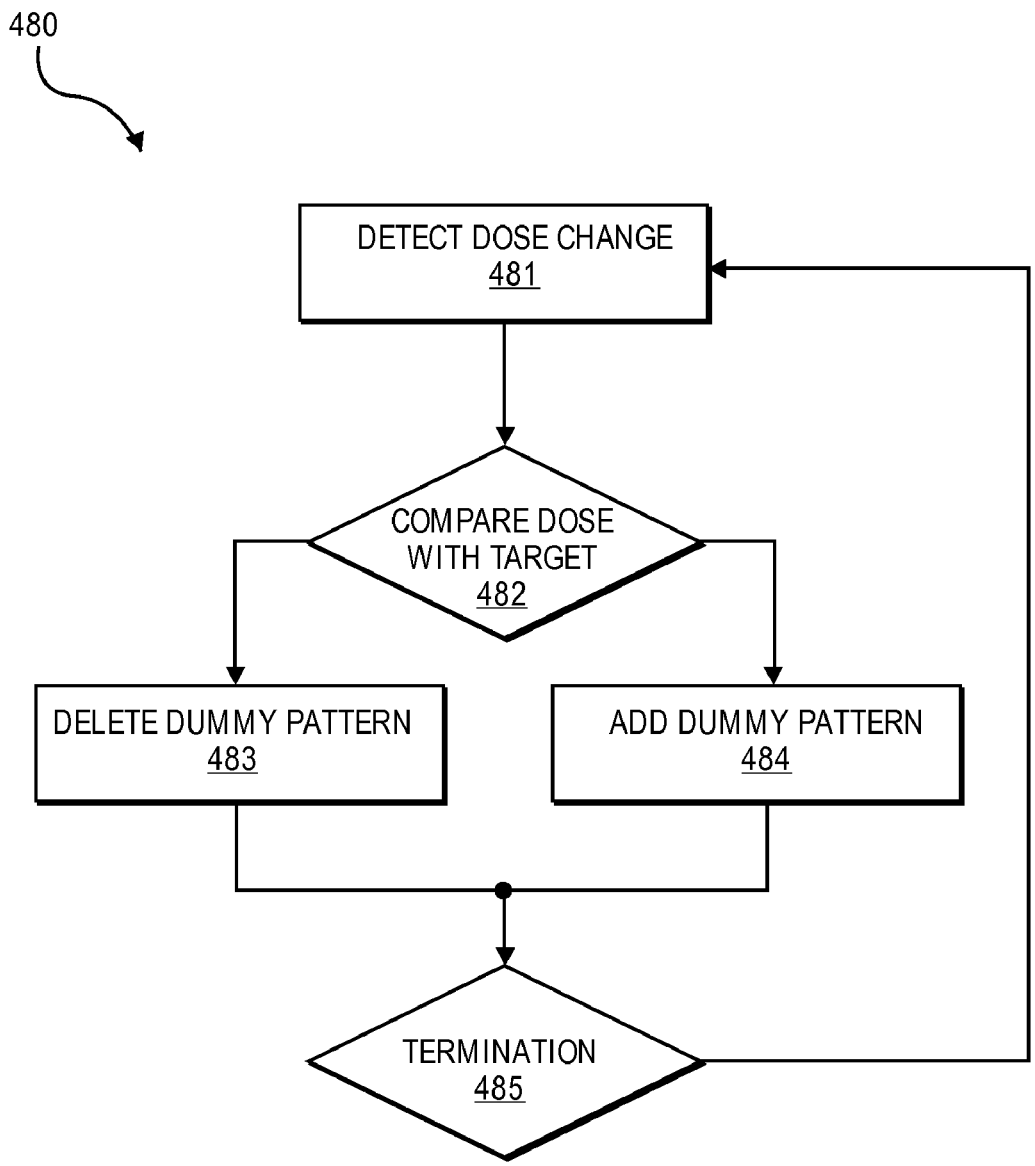
FIG. 4E shows one embodiment of a process flow for dose profile equalization.

FIG. 4E shows one embodiment of a method 480 for dose correction. A region that may need improvement of dose correction is detected in step 481. In one aspect, the region can be detected by focusing on the difference of the energy between adjacent regions. In step 482, if an increase of deposited energy is needed comparing with a target value, the method 480 proceeds to step 484. Otherwise, in step 482, if the decrease is needed, the method 480 proceeds to step 483. In Step 484, appropriate dummy patterns are added. In step 483, appropriate dummy patterns are deleted. In both steps 483 and 484, the metal coverage rule for CMP may be obeyed. In the method 480, step 485 is a judging step for termination, the process will stop if no improvement is observed or the target value is achieved.

Embodiments of a recalculation method for dose correction related to layout changes will be described.

In one aspect, addition or deletion of new patterns to a layout after completion of dose correction are sometimes needed. In such a case, dose correction from scratch or zero bases is time consuming. Issues of this type occur frequently in engineering changes or redesign. In addition to a chip design case, a similar issue occurs in layout of chips on a wafer as described herein. A method 800 that resolves such an issue is shown in FIG. 8.

Figure 7:
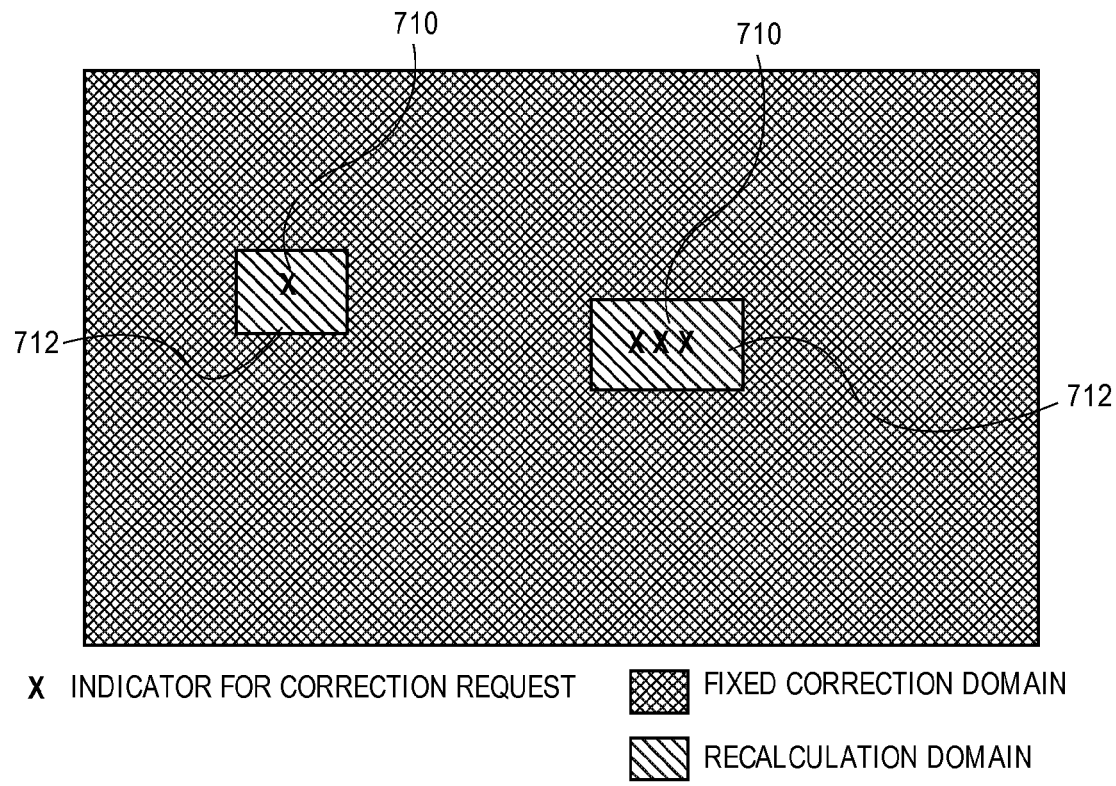
FIG. 7 shows an example of local modification of writing objects for dose correction and its influence to neighborhood.
Figure 8:
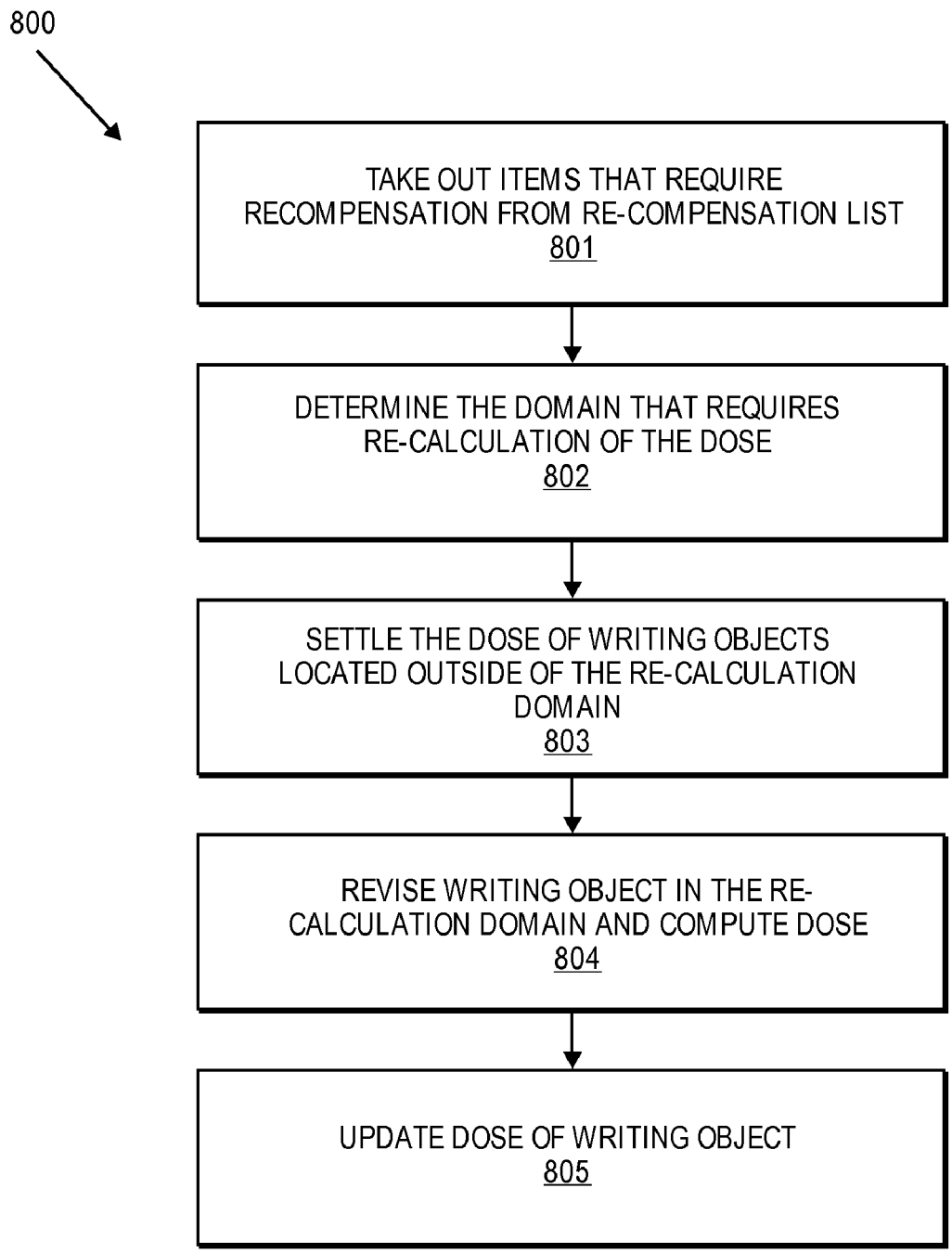
FIG. 8 shows one embodiment of a process flow for localizing writing objects for improvement.

FIG. 8 shows the method 800 for reduction of the computation for refinement of dose correction of writing objects by localizing influential area of the recalculation. As shown, the method 800 initiates in step 801, wherein writing objects that need re-correction of dose are extracted. By the re-correction of dose, writing objects that neighbor re-correction objects are to be re-corrected. In step 802, the method 800 calculates a range of influence, which will be described below in reference to FIG. 7. In step 803 of method 800, recalculation of dose correction is not done in a region where it is not necessary. On the other hand, dose intensity of writing objects that relate to Recalculation Area is re-calculated. In step 804, the method 800 revises the writing object in the recalculation domain and computes dose. In step 805, the method 800 updates dose intensity of the writing object.

For reference, FIG. 7 shows one embodiment of the range of influence. X mark is an indicator for the writing objects that may need improvement of dose correction. Recalculation of dose is needed for writing objects adjacent to the X marked object because newly calculated dose intensity of the objects gives influence to the adjacent objects. A domain that may need recalculation of the dose is referred to as Recalculation Domain, and a domain that does not need recalculation because of no influence of the dose change is referred to as Fixed Correction Domain. As shown in FIG. 7, the point that may need a change is indicated by X mark 710, and an area 712 that may need recalculation is indicated as surrounding area around the point. Backscattering range $\beta_b$ is very important for determining the range. An influence of patterns faraway from a pattern is negligible, for example if the range is 4 times of the backscattering range or 4×10 um by radius, it is reasonable to ignore the influence. Using above mentioned characteristics, Recalculation Area that may need recalculation of dose-correction can be determined by $\beta_b$.

Proximity effect correction, such as dose correction, is a mandatory process for accurate lithography writing by a particle beam writer represented by an e-beam writer. Conventionally, several methods were invented for the dose correction because that process may need high degree of precision and large amounts of computing resources. There is a generally known accuracy problem regarding the width of a thin wire pattern that is located orthogonal to a large pattern.

Use of finer mesh for improving approximation of dose correction is frequently used in conventional technologies. Other methods use a higher order approximation formula. One problem with the finer mesh method is that the needed computing power increases in geometric progression. For example, using mesh of half size results in four times the original number of meshes and computing resources. In the case of higher order approximation, re-calculation of the subject region for one level higher order approximation may be needed, and results in an increase of computing resource again.

In some embodiments, highly accurate dose correction is achievable with reasonable computing resources, by means of (1) easily detecting a region or writing objects that have insufficient dose correction, and (2) easily localizing a region that may need accuracy improvement. Writing objects are all objects for writing, and patterns written by CP Cell method and VSB are included.

An area density method that uses finer mesh for improving accuracy of dose correction is not applicable to writing by CP-Cell. The reason is that CP-Cell is written by one shot with the same dose intensity. This nature of CP-Cell does not allow the use of finer mesh, which divides a CP-Cell for improving accuracy of the correction. Some embodiments described herein allows for different dose intensity in a CP-Cell by switching CP-Cell patterns into VSB. Even in a case of writing by both CP-Cell and VSB, the improvement of accuracy can be achievable by the switching from CP-Cell to VSB for the critical area.

For high precision lithography writing by a particle beam writer, such as an e-beam writer, dose correction is an indispensable step to avoid degradation of written patterns by proximity effect. Investigation of patterns that are generated by a correction method and distributed in a large region shows that accuracy of a written pattern varies depending on the place or position where the pattern is placed or positioned. Refinement or improvement of accuracy of a region or a writing object that shows low accuracy is achievable by re-calculation of dose correction. By using technologies by some embodiments as described herein, improvement of accuracy of dose correction can be achieved effectively in terms of computing resources. Some embodiments of the invention may be applicable to a partial layout charge after dose correction case that may need local re-calculation of dose correction.

In one embodiment, the time needed for improvement or recalculation of dose correction is reduced by localizing the region or limiting the object that need improvement.

In another embodiment, detection of a possibly inaccurately dose corrected region can be done without calculation of dose intensity, and as a result, this allows effective improvement of dose correction accuracy.

To improve dose correction accuracy, the efficient method that detects inaccurately dose corrected writing objects and regions by small computation effort may be provided. A direct approach of detecting inaccurate region or object may need lithography simulation and measurement of dimension on a computer. Compared to conventional methods, the technology presented herein detects inaccurately dose corrected writing objects and regions by a simple calculation based on dose intensity for each region or writing object. Moreover, in case of area density method that divides the writing area by mesh, the inaccurately dose corrected mesh can be detected based on the area density. This detection technology improves efficiency of the method.

In some embodiments, the technologies presented herein provide means for improving accuracy of dose correction. One method is applicable to a case that insufficiency of dose correction in writing by CP-Cell is observed. The idea is switching writing by CP Cell to writing by VSB. By switching, more appropriate dose intensity can be assigned to each pattern that constitutes the CP-Cell than writing by one shot of CP-Cell. In case accuracy of the pattern written by VSB is insufficient, other means for accuracy improvement is available. By finely dividing the inaccurate pattern written by VSB, more accurate dose assignment to each divided pattern is possible, and as a result, accuracy of the dose correction increases. In the area density method case that uses mesh for the approximation of dose correction, the accuracy improvement of the inaccurate mesh is possible by splitting meshes related to the inaccurate mesh.

In one embodiment, for improving accuracy of dose correction, a deposited energy equalization method by placing a dummy pattern is proposed. By using this method, improvement of dose correction accuracy without writing pattern splitting becomes possible.

In one embodiment, a recalculation of dose correction related to a layout design change is another technology. In one aspect, there is a case in which some layout modification or addition of patterns after dose correction is needed. In this case, recalculation of dose correction is needed again. Dose correction is a time consuming step and a device for efficiency improvement of the correction is important. By one embodiment, efficient dose correction becomes possible by extracting a minimum set of writing objects that is needed for the recalculation.

In some embodiments, a higher order approximation method for improving dose correction has been proposed. The conventionally proposed method starts from a first order dose correction for basis of higher order approximation followed by a second order approximation for higher order correction, which is based on the first order results if the first order dose correction succeeds. If high order correction is needed, the procedure repeats based on the current results. By the conventional technologies, computational time is a problem because dose correction of all writing objects in the interested region is to be recalculated.

In one embodiment, for higher order approximation, the method restricts a region that may need recalculation by a technology comprising detecting writing objects that need recalculation of dose intensity, and a calculation method that localizes a region influenced by the update of dose intensity. By this region localization method, the fast calculation of virtually higher order approximation becomes possible. Some embodiments described herein allow for highly accurate writing by a particle beam writer, such as an e-beam writer.

Other conventional technology for improvement of dose correction by an area density method is to use fine mesh. The problem of this method is that there is a trade off between accuracy and CPU time. That is, if fine mesh is used for accuracy, the computation time will increase. One method of solving this issue comprises, dose correction using ordinary mesh, detecting writing objects that need refinement of dose correction, determination of influenced domain, dividing mesh, and recalculating dose correction. By the above mentioned method, accurate dose correction result is quickly obtained. By one embodiment, highly accurate writing becomes achievable by particle beam writers.

In one embodiment, improving accuracy of the particle beam lithography for semiconductor an integrated circuit is considered. However, some embodiments of technologies presented herein are applicable not only to semiconductor integrated circuits but also applicable to manufacturing of MEMS (Micro-Electro-Mechanical Systems), magnetic head, and other general nano-fabrication technologies.

Figure 9:
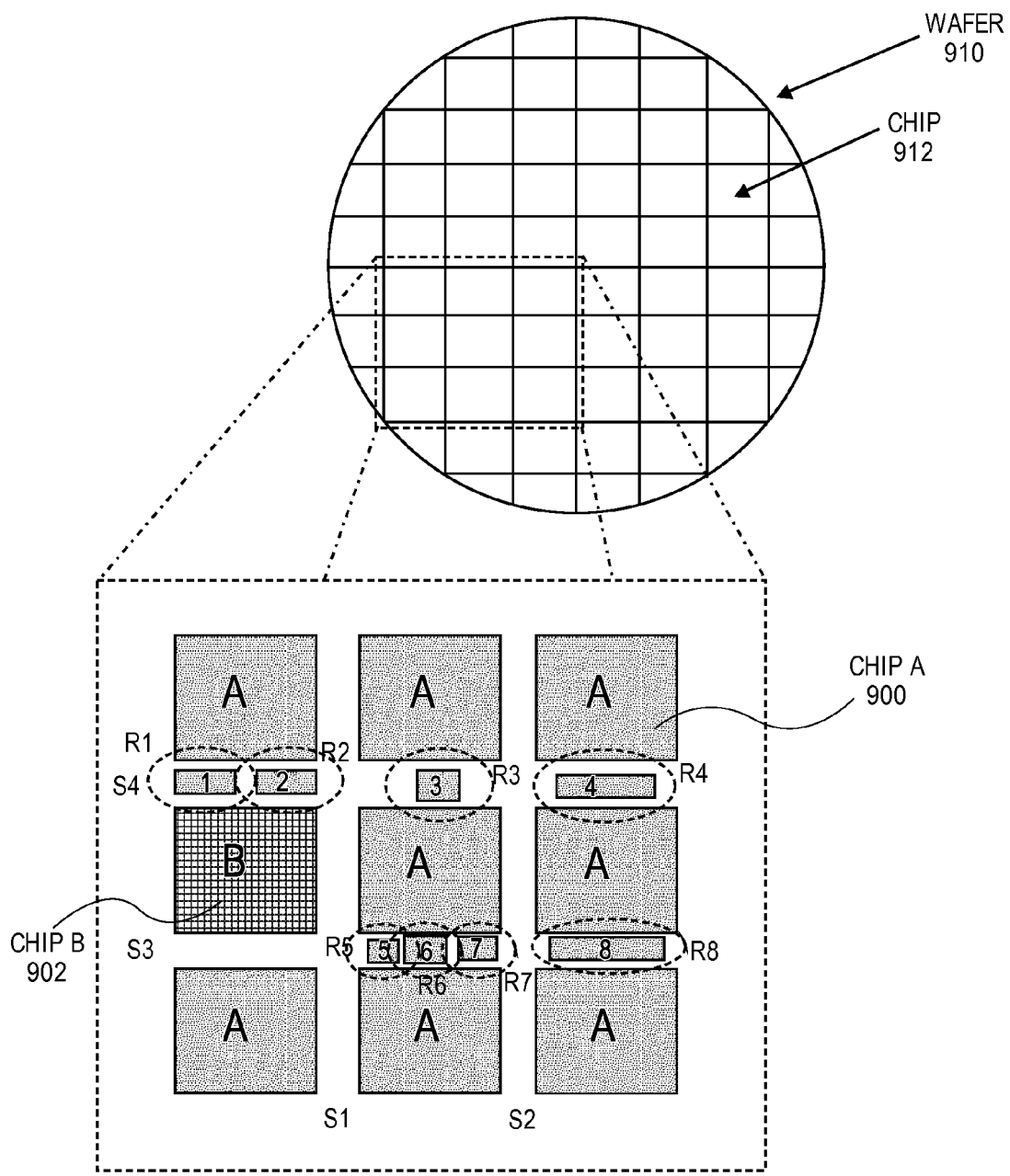
FIG. 9 shows one embodiment of a wafer level layout and proximity effect of the wafer.

FIG. 9 shows an alternate embodiment of the invention. As shown in FIG. 9, dose correction which is not on chip but on wafer or arrays of chips on the wafer is described. Semiconductor circuits indicated by "Chip" 912 are placed on a circular semiconductor substrate indicated by "Wafer" 910. Rectangular objects 900, 902 indicated by "A" and "B" are semiconductor chips. Rectangular open space extended from S1 and S2 to the upper part is referred to as a scribe line. Other rectangular open spaces extended from S3 and S4 to the right part are also referred to as a scribe line. In general, the scribe line is a space for cutting out chips from the wafer, and TEG or test circuit may be placed on the scribe line. Rectangles indicated by numerals 1~9 comprise additional patterns, such as a test circuit, for example. Regions that are affected by backscattering of added patterns are indicated by R1~R8. In one aspect, recalculation of dose correction is needed in a region near additional patterns. For example, test circuits which are added when chip are placed on the wafer for writing. By this alternate embodiment, dose correction on wafer can be performed effectively with smaller computation time.

Moreover, FIG. 9 shows an example of direct writing of a wafer by the particle beam writer in which chips are arrayed on the wafer. Chip A 900 and chip B 902 are placed on a wafer 910 and test patterns for a process evaluation are placed on scribe lines. Although dose correction of chip A 900 and chip B 902 on a wafer are independently achievable, there is an issue that patterns placed near the chip may give bad influence on the results of dose correction. Added patterns, such as indicated by number 1~8 provide influence to ellipse regions indicated by R1~R3. Even an influence of a chip adjacently placed cannot be ignored. One possible solution of this issue is to do dose correction of whole patterns on the wafer at once. However this solution is not practical. A practical solution is desired.

Repetitively placing chips on a wafer is a common way of wafer layout. A strategy for improving computing efficiency of the dose correction is use of repetitive structure. Reuse of dose correction result for each chip to repetitive entities on the wafer is the most effective way. However, because of additional patterns placed near and adjacent chip, use of identical dose correction result is not acceptable. As depicted in FIG. 9, a dose correction of wafer layout comprising chip A 900, chip B 902, and additional patterns like 1~3 is achievable by a technology of an alternate embodiment of the invention, which comprises a determination of a region where backscattering or proximity effect interacts each other and a method of dose correction in the region. Although regions affected by backscattering or proximity effect of chip A 900 and chip B 902 are omitted for simplicity of the illustration in FIG. 9, chip peripheral region and additional pattern area is the object domain of recalculation. The alternate embodiment reduces CPU times significantly for wafer level dose correction.

Either particle beam direct writing or optical lithography that uses a photo mask, dividing of layout patterns before transferring to the writing equipment is needed. This is mandatory because a set of writable shapes in the writer is limited and transfer of general layout patterns to the set of writable shape is needed. The process may be referred to as fracturing. Quality of the fracturing has big impact on the quality of the written image. Some embodiments described herein may contribute to the improvement of image accuracy. It should be appreciated that embodiments of the invention are applicable to fracturing with minor modification. In other words, accuracy of written image can be improved by finer dividing of the pattern in a region that is steeply changing deposit energy.

Figure 10:
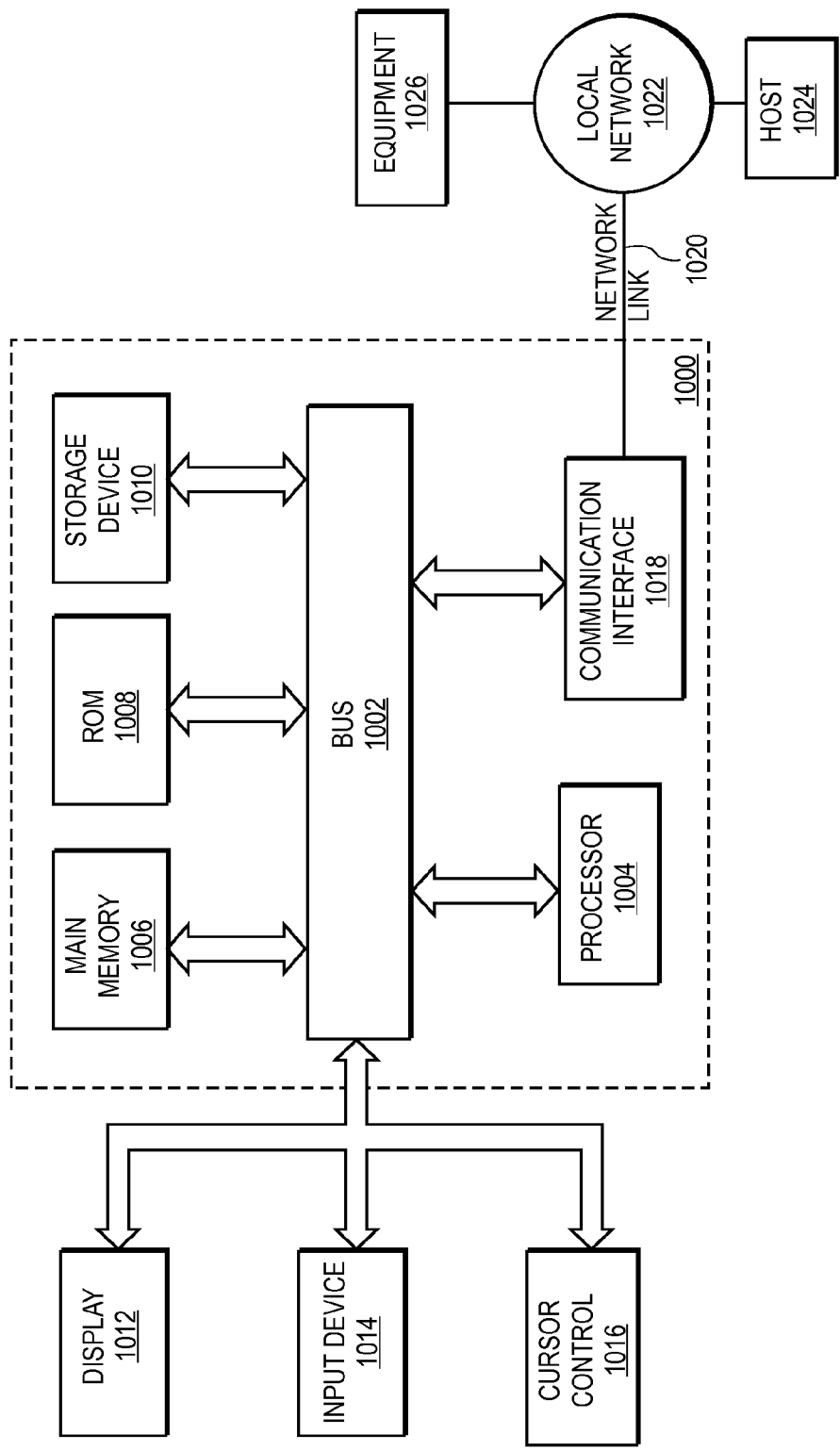
FIG. 10 shows one embodiment of a computer system with which embodiments of the invention may be implemented.

FIG. 10 shows an example of an embodiment of a block diagram of a computer system 1000 that may be used to implement embodiments of the invention described herein. In particular, the computer system 1000 stores and executes a computer software program for performing any of the functions or steps described herein. The computer system 1000 includes a bus 1002 or other communication mechanism for communicating information, and a processor 1004 coupled with the bus 1002 for processing information. The computer system 1000 also includes a main memory 1006, such as a random access memory (RAM) or other dynamic storage device, coupled to the bus 1002 for storing information and instructions to be executed by the processor 1004. The main memory 1006 also may be used for storing temporary variables or other intermediate information during execution of instructions to be executed by the processor 1004. The computer system 1000 further includes a read only memory (ROM) 1008 or other static storage device coupled to the bus 1002 for storing static information and instructions for the processor 1004. A data storage device 1010, such as a magnetic disk or optical disk, is provided and coupled to the bus 1002 for storing information and instructions.

The computer system 1000 may be coupled via the bus 1002 to a display 1012, such as a cathode ray tube (CRT), for displaying information to a user. An input device 1014, including alphanumeric and other keys, is coupled to the bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane.

Embodiments of the invention are related to the use of computer system 1000 for improving dose correction of particle beam writers. In one embodiment, such use is provided by computer system 1000 in response to processor 1004 executing one or more sequences of one or more instructions contained in the main memory 1006. Such instructions may be read into the main memory 1006 from another computer-readable medium, such as storage device 1010. Execution of the sequences of instructions contained in the main memory 1006 causes the processor 1004 to perform the process steps described herein. One or more processors in a multi-processing arrangement may also be employed to execute the sequences of instructions contained in the main memory 1006. In alternative embodiments, hard-wired circuitry may be used in place of or in combination with software instructions to implement some embodiments of the invention. Thus, embodiments of the invention are not limited to any specific combination of hardware circuitry and software.

The term "computer-readable medium" as used herein refers to any medium that participates in providing instructions to the processor 1004 for execution. Such a medium may take many forms, including but not limited to, non-volatile media, volatile media, and transmission media. Non-volatile media includes, for example, optical or magnetic disks, such as the storage device 1010. Volatile media includes dynamic memory, such as the main memory 1006. Transmission media includes coaxial cables, copper wire and fiber optics, including the wires that comprise the bus 1002. Transmission media may also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer may read.

Various forms of computer-readable media may be involved in carrying one or more sequences of one or more instructions to the processor 1004 for execution. For example, the instructions may initially be carried on a magnetic disk of a remote computer. The remote computer may load the instructions into its dynamic memory and send the instructions over a telephone line using a modem. A modem local to the computer system 1000 may receive the data on the telephone line and use an infrared transmitter to convert the data to an infrared signal. An infrared detector coupled to the bus 1002 may receive the data carried in the infrared signal and place the data on the bus 1002. The bus 1002 carries the data to the main memory 1006, from which the processor 1004 retrieves and executes the instructions. The instructions received by the main memory 1006 may optionally be stored on the storage device 1010 either before or after execution by the processor 1004.

The computer system 1000 also includes a communication interface 1018 coupled to the bus 1002. The communication interface 1018 provides a two-way data communication coupling to a network link 1020 that is connected to a local network 1022. For example, the communication interface 1018 may be an integrated services digital network (ISDN) card or a modem to provide a data communication connection to a corresponding type of telephone line. As another example, the communication interface 1018 may be a local area network (LAN) card to provide a data communication connection to a compatible LAN. Wireless links may also be implemented. In any such implementation, the communication interface 1018 sends and receives electrical, electromagnetic or optical signals that carry data streams representing various types of information.

The network link 1020 typically provides data communication through one or more networks to other devices. For example, the network link 1020 may provide a connection through local network 1022 to a host computer 1024 or to another equipment 1026. The data streams transported over the network link 1020 may comprise electrical, electromagnetic or optical signals. The signals through the various networks and the signals on the network link 1020 and through the communication interface 1018, which carry data to and from the computer system 1000, are exemplary forms of carrier waves transporting the information. The computer system 1000 may send messages and receive data, including program code, through the network(s), the network link 1020, and the communication interface 1018.

Although particular embodiments of the invention have been shown and described, it will be understood that it is not intended to limit the invention to the preferred embodiments, and it will be obvious to those skilled in the art that various changes and modifications may be made without departing from the scope of the invention. The specification and drawings are, accordingly, to be regarded in an illustrative rather than restrictive sense. The invention is intended to cover alternates, modifications, and equivalents, which may be included within the scope of the invention as defined by the claims.

What is claimed is:

1. A method for dose correction of a particle beam writing device, the method comprising:
   reading a file of one or more writing objects that includes dose intensity;
   calculating, by using a processor, a rate of dose intensity change between adjacent writing objects;
   selecting at least one writing object that needs accuracy improvement of dose correction based at least in part upon the rate of dose intensity change;
   improving accuracy of the dose correction of the at least one selected writing object; and
   performing dose correction.

2. The method of claim 1, wherein the writing objects include at least one of Variable Shaped Beam (VSB) objects and Cell Projection (CP) objects.

3. The method of claim 1, further comprising generating a representative point pair graph, wherein points are representative points of the writing objects.

4. The method of claim 3, wherein calculating a rate of dose intensity change between adjacent writing objects comprises calculating a dose difference rate defined by a difference of dose to a distance between two points for each edge of a point pair graph.

5. The method of claim 4, wherein selecting at least one writing object comprises selecting edges of a point pair graph that have high dose difference rates and store them in a list for countermeasure.

6. The method of claim 5, wherein improving accuracy of the dose correction comprises improving the dose correction of writing objects related to the edge in the list.

7. The method of claim 1, further comprising improving accuracy of the dose correction of adjacent writing objects that are adjacent to the at least one selected writing object.

8. The method of claim 1, wherein improving accuracy of the dose correction includes splitting a pattern of the at least one writing object into a plurality of finer patterns for improvement of the dose correction accuracy.

9. The method of claim 8, wherein the pattern of the at least one selected writing object comprises a pattern written by variable shaped beam (VSB).

10. The method of claim 1, wherein improving accuracy of the dose correction includes applying a higher order approximation formula for the dose correction to a region of the at least one writing object that needs improvement of the dose correction accuracy.

11. The method of claim 1, further comprising detecting a region of the at least one writing object that needs improvement of dose correction by using a changing ratio of area densities between adjacent regions, which is calculated by a ratio of a writing pattern to a region area.

12. The method of claim 1, wherein improving accuracy of the dose correction of the at least one selected writing object comprises switching writing objects for a CP cell into writing objects for VSB.

13. A dose correction method for recalculating dose intensity of a pre-calculated layout file, in connection with minor modification of the layout, for a particle beam writing device, the method comprising:
    extracting a writing object from the layout file;
    determining a set of recalculation objects that are in a region influenced by the proximity effect of the extracted writing object; and
    calculating corrected dose intensity of the set of recalculation objects, wherein the act of calculating comprises using a processor to change a rate of dose intensity between adjacent writing objects.

14. The method of claim 13, wherein the extracted writing object is added, deleted or modified from the layout file.

15. The method of claim 14, wherein the region is influenced by the proximity effect of the modified or added objects.

16. The method of claim 13, further comprising dividing the region by mesh.

17. The method of claim 16, wherein dividing the region by mesh comprises:
    extracting the writing object for add, delete or modification of layout from the layout file;
    determining a recalculation mesh that includes an addition object, a deletion object, and a writing object within a region influenced by the writing object within the region influenced by proximity effect from the addition and deletion object; and
    re-calculating the mesh.

18. A dose correction method for a particle beam writing device, the method comprising:
    identifying one or more meshes that cover a dose correction region;
    calculating area density of the one or more meshes;
    computing, using a processor, a ratio of area density difference between adjacent meshes;
    detecting a mesh that needs splitting; and
    splitting the detected mesh.

19. The method of claim 18, wherein splitting of a mesh is determined by considering area density of meshes in a neighboring region that is determined by a backscattering range of a particle beam of the particle beam writing device.

20. A writing object splitting method for a particle beam writing device, the method comprising:
    determining a group of adjacent writing objects using a backscattering range based distance from a considered writing object;
    partitioning the group of adjacent writing objects into plural regions;
    computing, by using a processor, a difference of the area density between the regions; and
    splitting the considered writing object based at least in part upon the difference of area density between the regions of the group of the adjacent writing objects.

21. A dose correction method for a particle beam writing device, the method comprising:
    reading a file of one or more writing objects that includes one or more dummy patterns;
    calculating, using a processor, a rate of dose intensity change between adjacent writing objects; and
    controlling deposition energy of a particle beam of the particle beam writing device by adding or erasing a dummy pattern that has no circuit connection.

22. The method of claim 21, further comprising:
    detecting a region where difference of deposited energy between the region and adjacent regions is larger than a specified value;
    erasing the dummy pattern of the detected region detected within a permitted range of a metal coverage design rule when dose intensity is in excess; and
    adding the dummy pattern to the detected region within a permitted range of a metal coverage design rule when dose intensity is low.

23. The method of claim 22, further comprising repeating the process of claim 22 until no improvement of deposited energy equalization is observed or until achieving a target flatness of deposited energy.

24. A computer system for dose correction of a particle beam writing device, the method comprising:
    a processor for:
    reading a file of one or more writing objects that includes dose intensity;
    calculating a rate of dose intensity change between adjacent writing objects;
    selecting at least one writing object that needs accuracy improvement of dose correction based at least in part upon the rate of dose intensity change;
    improving accuracy of the dose correction of the at least one selected writing object; and
    performing dose correction.

25. The system of claim 24, wherein the writing objects include at least one of Variable Shaped Beam (VSB) objects and Cell Projection (CP) objects.

26. The system of claim 24, further comprising means for generating a representative point pair graph, wherein points are representative points of the writing objects.

27. The system of claim 26, wherein the calculating a rate of dose intensity change between adjacent writing objects comprises calculating a dose difference rate defined by a difference of dose to a distance between two points for each edge of a point pair graph.

28. The system of claim 27, wherein the selecting at least one writing object comprises selecting edges of a point pair graph that have high dose difference rates and store them in a list for countermeasure.

29. The system of claim 28, wherein the improving accuracy of the dose correction comprises improving the dose correction of writing objects related to the edge in the list.

30. The system of claim 24, further comprising means for improving accuracy of the dose correction of adjacent writing objects that are adjacent to the at least one selected writing object.

31. The system of claim 24, wherein the improving accuracy of the dose correction includes splitting a pattern of the at least one writing object into a plurality of finer patterns for improvement of the dose correction accuracy.

32. The system of claim 31, wherein the pattern of the at least one selected writing object comprises a pattern written by variable shaped beam (VSB).

33. The system of claim 24, wherein the improving accuracy of the dose correction includes applying a higher order approximation formula for the dose correction to a region of the at least one writing object that needs improvement of the dose correction accuracy.

34. The system of claim 24, further comprising means for detecting a region of the at least one writing object that needs improvement of dose correction by using a changing ratio of area densities between adjacent regions, which is calculated by a ratio of a writing pattern to a region area.

35. The system of claim 24, wherein the improving accuracy of the dose correction of the at least one selected writing object comprises switching writing objects for a CP cell into writing objects for VSB.

36. A computer program product that includes a computer-readable medium having a sequence of instructions which, when executed by a processor, causes the processor to execute a process for dose correction of a particle beam writing device, the process comprising:
 reading a file of one or more writing objects that includes dose intensity;
 calculating a rate of dose intensity change between adjacent writing objects;
 selecting at least one writing object that needs accuracy improvement of dose correction based at least in part upon the rate of dose intensity change;
 improving accuracy of the dose correction of the at least one selected writing object; and
 performing dose correction.

37. The computer program product of claim 36, wherein the writing objects include at least one of Variable Shaped Beam (VSB) objects and Cell Projection (CP) objects.

38. The computer program product of claim 36, further comprising generating a representative point pair graph, wherein points are representative points of the writing objects.

39. The computer program product of claim 38, wherein calculating a rate of dose intensity change between adjacent writing objects comprises calculating a dose difference rate defined by a difference of dose to a distance between two points for each edge of a point pair graph.

40. The computer program product of claim 39, wherein selecting at least one writing object comprises selecting edges of a point pair graph that have high dose difference rates and store them in a list for countermeasure.

41. The computer program product of claim 40, wherein improving accuracy of the dose correction comprises improving the dose correction of writing objects related to the edge in the list.

42. The computer program product of claim 36, further comprising improving accuracy of the dose correction of adjacent writing objects that are adjacent to the at least one selected writing object.

43. The computer program product of claim 36, wherein improving accuracy of the dose correction includes splitting a pattern of the at least one writing object into a plurality of finer patterns for improvement of the dose correction accuracy.

44. The computer program product of claim 43, wherein the pattern of the at least one selected writing object comprises a pattern written by variable shaped beam (VSB).

45. The computer program product of claim 36, wherein improving accuracy of the dose correction includes applying a higher order approximation formula for the dose correction to a region of the at least one writing object that needs improvement of the dose correction accuracy.

46. The computer program product of claim 36, further comprising detecting a region of the at least one writing object that needs improvement of dose correction by using a changing ratio of area densities between adjacent regions, which is calculated by a ratio of a writing pattern to a region area.

47. The computer program product of claim 36, wherein improving accuracy of the dose correction of the at least one selected writing object comprises switching writing objects for a CP cell into writing objects for VSB.

* * * * *